(12) United States Patent
Deo

(10) Patent No.: US 12,137,509 B2
(45) Date of Patent: *Nov. 5, 2024

(54) CONFORMABLE POLYMER FOR FREQUENCY-SELECTABLE HEATING LOCATIONS

(71) Applicant: Anand Deo, Mendota Heights, MN (US)

(72) Inventor: Anand Deo, Mendota Heights, MN (US)

(*) Notice: Subject to any disclaimer, the term of this patent is extended or adjusted under 35 U.S.C. 154(b) by 0 days.

This patent is subject to a terminal disclaimer.

(21) Appl. No.: 18/334,703

(22) Filed: Jun. 14, 2023

(65) Prior Publication Data

US 2024/0008148 A1    Jan. 4, 2024

Related U.S. Application Data

(62) Division of application No. 18/046,414, filed on Oct. 13, 2022, now Pat. No. 11,729,869.

(Continued)

(51) Int. Cl.
*H05B 6/50* (2006.01)
*H10N 10/856* (2023.01)

(52) U.S. Cl.
CPC .............. *H05B 6/50* (2013.01); *H10N 10/856* (2023.02)

(58) Field of Classification Search
CPC ... H05B 6/44; H05B 6/46; H05B 6/48; H05B 6/50; H05B 6/52; H05B 6/6447;

(Continued)

(56) References Cited

U.S. PATENT DOCUMENTS 3,780,255 A    12/1973    Boom
4,338,575 A    7/1982    Hartemann
(Continued)

FOREIGN PATENT DOCUMENTS

CA    2993930 A1    2/2017
CN    106267534 A    1/2017
(Continued)

OTHER PUBLICATIONS

"U.S. Appl. No. 15/165,096, Notice of Allowance mailed Aug. 31, 2016", 9 pgs.

(Continued)

*Primary Examiner* — Hung D Nguyen
(74) *Attorney, Agent, or Firm* — Schwegman Lundberg & Woessner, P.A.

(57) ABSTRACT

A lossy dielectric heat source transducer or other transducer can be formed using a multi-layer substrate, such as can include a power layer (to receive an applied electromagnetic input signal), a polyurethane or other polymeric electromagnetic energy absorption layer, and a coupling layer therebetween. The absorption layer can be doped with carbon or another dopant material to increase electromagnetic energy absorption. The coupling layer can be doped with barium titanate or another dopant material to focus electromagnetic energy passing through the coupling layer toward the absorption layer. Frequency-selective addressing of particular transducers can include using a plurality of planar resonators, which can be configured to resonate at the same or different specified frequencies of the applied electromagnetic input. Such addressing of such frequency-sensitive structures can permit location-specific actuation of one or more transducers.

20 Claims, 14 Drawing Sheets

Related U.S. Application Data

(60) Provisional application No. 63/262,477, filed on Oct. 13, 2021.

(58) Field of Classification Search
CPC ........ H05B 6/686; H05B 6/687; H05B 6/688; H05B 6/701; H05B 6/705; H05B 6/707; H05B 6/72; H05B 6/80; H05B 6/806; H10N 10/856
See application file for complete search history.

(56) References Cited

U.S. PATENT DOCUMENTS

| | | | |
|---|---|---|---|
| 4,945,912 A | 8/1990 | Langberg |
| 5,037,395 A | 8/1991 | Spencer |
| 5,057,105 A | 10/1991 | Malone et al. |
| 5,191,883 A | 3/1993 | Lennox et al. |
| 5,257,635 A | 11/1993 | Langberg |
| 5,260,020 A | 11/1993 | Wilk et al. |
| 5,290,490 A | 3/1994 | Nied et al. |
| 5,498,261 A | 3/1996 | Strul |
| 5,810,802 A | 9/1998 | Panescu et al. |
| 5,891,182 A | 4/1999 | Fleming |
| 6,157,804 A | 12/2000 | Richmond et al. |
| 6,387,052 B1 | 5/2002 | Quinn et al. |
| 6,426,277 B1 | 7/2002 | Bae et al. |
| 6,443,547 B1 | 9/2002 | Takahashi et al. |
| 6,511,851 B1 | 1/2003 | Payne et al. |
| 6,537,864 B1 | 3/2003 | Aya et al. |
| 6,537,927 B1 | 3/2003 | Son |
| 6,825,734 B2 | 11/2004 | Clark |
| 6,901,683 B2 | 6/2005 | Lyle et al. |
| 7,133,180 B2 | 11/2006 | Ilchenko et al. |
| 7,160,297 B2 | 1/2007 | Nesbitt |
| 7,274,262 B2 | 9/2007 | Ham et al. |
| 7,317,216 B2 | 1/2008 | Holm-kennedy |
| 7,393,501 B2 | 7/2008 | Zumeris et al. |
| 7,429,719 B1 | 9/2008 | Spetz |
| 7,586,381 B2 | 9/2009 | Rohde et al. |
| 7,844,345 B2 | 11/2010 | Boling et al. |
| 8,381,601 B2 | 2/2013 | Stumpf |
| 8,698,570 B2 | 4/2014 | Afshari et al. |
| 8,905,772 B2 | 12/2014 | Rogers et al. |
| 8,933,416 B2 | 1/2015 | Arcand et al. |
| 9,008,793 B1 | 4/2015 | Cosman, Sr. et al. |
| 9,156,228 B2 | 10/2015 | Buehring et al. |
| 9,362,604 B2 | 6/2016 | Denis et al. |
| 9,536,758 B1 | 1/2017 | Deo |
| 9,675,402 B2 | 6/2017 | Yasunaga |
| 10,326,426 B2 | 6/2019 | Bhattacharjee |
| 10,431,478 B2 | 10/2019 | Deo |
| 10,515,831 B2 | 12/2019 | Deo |
| 10,553,462 B2 | 2/2020 | Deo |
| 11,152,232 B2 | 10/2021 | Deo |
| 11,610,791 B2 | 3/2023 | Deo |
| 11,712,368 B2 | 8/2023 | Deo |
| 11,729,869 B2 | 8/2023 | Deo |
| 2002/0065052 A1 | 5/2002 | Pande et al. |
| 2002/0120296 A1 | 8/2002 | Mech et al. |
| 2003/0164371 A1 | 9/2003 | Bergstrom et al. |
| 2003/0205571 A1 | 11/2003 | Flugstad et al. |
| 2005/0068116 A1 | 3/2005 | Ham et al. |
| 2005/0083785 A1 | 4/2005 | Shiokawa et al. |
| 2006/0071237 A1 | 4/2006 | Deboy et al. |
| 2007/0161263 A1 | 7/2007 | Meisner |
| 2007/0260239 A1 | 11/2007 | Podhajsky et al. |
| 2009/0054881 A1 | 2/2009 | Krespi |
| 2009/0071952 A1 | 3/2009 | Kuwabara |
| 2009/0131845 A1 | 5/2009 | Gurtner et al. |
| 2009/0131854 A1 | 5/2009 | DiCarlo et al. |
| 2009/0162954 A1 | 6/2009 | Griffin, Jr. et al. |
| 2009/0256649 A1 | 10/2009 | Taniguchi |
| 2010/0030210 A1 | 2/2010 | Paulus |
| 2010/0036375 A1 | 2/2010 | Regadas |
| 2010/0036405 A1 | 2/2010 | Giordano et al. |
| 2010/0191232 A1 | 7/2010 | Boveda |
| 2010/0217259 A1 | 8/2010 | Strauss |
| 2010/0249692 A1 | 9/2010 | Dacey, Jr. et al. |
| 2010/0286691 A1 | 11/2010 | Kerr et al. |
| 2011/0137390 A1 | 6/2011 | Hill |
| 2011/0152790 A1 | 6/2011 | Dacey, Jr. et al. |
| 2011/0226759 A1 | 9/2011 | Wander et al. |
| 2012/0029500 A1 | 2/2012 | Jenson |
| 2012/0152935 A1 | 6/2012 | Kitaizumi et al. |
| 2012/0261405 A1 | 10/2012 | Kurose et al. |
| 2012/0330393 A1 | 12/2012 | Janik et al. |
| 2013/0096595 A1 | 4/2013 | Myhr et al. |
| 2013/0282084 A1 | 10/2013 | Mathur et al. |
| 2014/0088674 A1 | 3/2014 | Bradley |
| 2014/0257272 A1 | 9/2014 | Clark et al. |
| 2015/0119877 A1 | 4/2015 | Jameson et al. |
| 2015/0289316 A1 | 10/2015 | Shimizu et al. |
| 2017/0258628 A1 | 9/2017 | Awasthi |
| 2018/0042667 A1 | 2/2018 | Pappone et al. |
| 2018/0323090 A1 | 11/2018 | Deo |
| 2019/0109024 A1 | 4/2019 | Deo |
| 2020/0013644 A1 | 1/2020 | Deo |
| 2020/0118846 A1 | 4/2020 | Deo |
| 2020/0135507 A1 | 4/2020 | Deo |
| 2020/0176283 A1 | 6/2020 | Deo |
| 2022/0108899 A1 | 4/2022 | Deo |
| 2023/0111595 A1 | 4/2023 | Deo |
| 2023/0181354 A1 | 6/2023 | Deo |
| 2023/0390107 A1 | 12/2023 | Deo |

FOREIGN PATENT DOCUMENTS

| | | |
|---|---|---|
| EP | 3113281 A1 | 1/2017 |
| EP | 3648693 | 4/2024 |
| GB | 1529941 A | 10/1978 |
| WO | WO-9600039 A1 | 1/1996 |
| WO | WO-2012153529 A1 | 11/2012 |
| WO | WO-2016181397 A1 | 11/2016 |
| WO | WO-2017204860 A1 | 11/2017 |
| WO | WO-2019010238 A1 | 1/2019 |
| WO | WO-2020010247 A1 | 1/2020 |
| WO | WO-2023064873 A1 | 4/2023 |

OTHER PUBLICATIONS

"U.S. Appl. No. 16/027,139, Corrected Notice of Allowability mailed Sep. 20, 2019", 3 pgs.

"U.S. Appl. No. 16/027,139, Corrected Notice of Allowability mailed Oct. 29, 2019", 3 pgs.

"U.S. Appl. No. 16/027,139, Examiner Interview Summary mailed Jun. 21, 2019", 3 pgs.

"U.S. Appl. No. 16/027,139, Non Final Office Action mailed Mar. 22, 2019", 13 pgs.

"U.S. Appl. No. 16/027,139, Non Final Office Action mailed Nov. 19, 2018", 11 pgs.

"U.S. Appl. No. 16/027,139, Notice of Allowance mailed Jul. 29, 2019", 8 pgs.

"U.S. Appl. No. 16/027,139, Response filed Dec. 10, 2018 to Non Final Office Action mailed Nov. 19, 2018", 12 pgs.

"U.S. Appl. No. 16/027,139, Response filed Jun. 20, 2019 to Non-Final Office Action mailed Mar. 22, 2019", 16 pgs.

"U.S. Appl. No. 16/200,120, Corrected Notice of Allowability mailed Aug. 26, 2019", 2 pgs.

"U.S. Appl. No. 16/200,120, Examiner Interview Summary mailed Apr. 11, 2019", 3 pgs.

"U.S. Appl. No. 16/200,120, Notice of Allowance mailed May 22, 2019", 5 pgs.

"U.S. Appl. No. 16/200,120, Response filed Mar. 25, 2019 to Non-Final Office Action mailed Jan. 24, 2019", 16 pgs.

"U.S. Appl. No. 16/200,120, Supplemental Response filed Apr. 8, 2019 to Non-Final Office Action mailed Jan. 24, 2019", 10 pgs.

"U.S. Appl. No. 16/502,989, Corrected Notice of Allowability mailed Oct. 31, 2019", 2 pgs.

"U.S. Appl. No. 16/502,989, Notice of Allowance mailed Sep. 25, 2019", 9 pgs.

(56) References Cited

OTHER PUBLICATIONS

"U.S. Appl. No. 16/502,989, Preliminary Amendment filed Jul. 11, 2019", 4 pgs.
"U.S. Appl. No. 16/548,809, Final Office Action mailed Aug. 24, 2022", 8 pgs.
"U.S. Appl. No. 16/548,809, Non Final Office Action mailed Mar. 3, 2022", 16 pgs.
"U.S. Appl. No. 16/548,809, Notice of Allowance mailed Nov. 9, 2022", 5 pgs.
"U.S. Appl. No. 16/548,809, Preliminary Amendment filed Jan. 6, 2020", 6 pgs.
"U.S. Appl. No. 16/548,809, Response filed Jun. 3, 2022 to Non Final Office Action mailed Mar. 3, 2022", 12 pgs.
"U.S. Appl. No. 16/548,809, Response filed Oct. 24, 2022 to Final Office Action mailed Aug. 24, 2022", 8 pgs.
"U.S. Appl. No. 16/666,773, 312 Amendment filed Jun. 6, 2023", 6 pgs.
"U.S. Appl. No. 16/666,773, Final Office Action mailed Jun. 16, 2022", 13 pgs.
"U.S. Appl. No. 16/666,773, Non Final Office Action mailed Feb. 16, 2022", 13 pgs.
"U.S. Appl. No. 16/666,773, Non Final Office Action mailed Oct. 3, 2022", 7 pgs.
"U.S. Appl. No. 16/666,773, Notice of Allowance mailed Mar. 7, 2023", 5 pgs.
"U.S. Appl. No. 16/666,773, Preliminary Amendment filed Jan. 21, 2020", 7 pgs.
"U.S. Appl. No. 16/666,773, PTO Response to Rule 312 Communication mailed Jun. 28, 2023", 2 pgs.
"U.S. Appl. No. 16/666,773, Response filed May 16, 2022 to Non Final Office Action mailed Feb. 16, 2022", 8 pgs.
"U.S. Appl. No. 16/666,773, Response filed Aug. 16, 2022 to Final Office Action mailed Jun. 16, 2022", 9 pgs.
"U.S. Appl. No. 16/666,773, Response filed Dec. 29, 2022 to Non Final Office Action mailed Oct. 3, 2022", 8 pgs.
"U.S. Appl. No. 16/780,554, Corrected Notice of Allowability mailed Sep. 15, 2021", 2 pgs.
"U.S. Appl. No. 16/780,554, Final Office Action mailed Jan. 27, 2021", 7 pgs.
"U.S. Appl. No. 16/780,554, Non Final Office Action mailed Sep. 22, 2020", 9 pgs.
"U.S. Appl. No. 16/780,554, Notice of Allowance mailed Apr. 29, 2021", 5 pgs.
"U.S. Appl. No. 16/780,554, Response filed Apr. 13, 2021 to Final Office Action mailed Jan. 27, 2021", 10 pgs.
"U.S. Appl. No. 16/780,554, Response filed Dec. 15, 2020 to Non Final Office Action mailed Sep. 22, 2020", 11 pgs.
"U.S. Appl. No. 17/444,855, Non Final Office Action mailed Aug. 1, 2023", 10 pgs.
"U.S. Appl. No. 18/046,414, 312 Amendment filed Mar. 20, 2023", 5 pgs.
"U.S. Appl. No. 18/046,414, Corrected Notice of Allowability mailed Mar. 29, 2023", 2 pgs.
"U.S. Appl. No. 18/046,414, Corrected Notice of Allowability mailed Jun. 20, 2023", 2 pgs.
"U.S. Appl. No. 18/046,414, Notice of Allowance mailed Mar. 16, 2023", 8 pgs.
"U.S. Appl. No. 18/046,414, Response filed Feb. 15, 2023 to Restriction Requirement mailed Feb. 14, 2023", 9 pgs.
"U.S. Appl. No. 18/046,414, Restriction Requirement mailed Feb. 14, 2023", 6 pgs.
"U.S. Appl. No. 18/164,087, Preliminary Amendment filed Jul. 28, 2023", 5 pgs.
"U.S. Appl. No. 18/329,653, Preliminary Amendment filed Aug. 28, 2023", 6 pgs.
"European Application Serial No. 16903365.1, Communication Pursuant to Article 94(3) EPC mailed May 11, 2021", 5 pgs.
"European Application Serial No. 16903365.1, Extended European Search Report mailed May 17, 2019", 8 pgs.
"European Application Serial No. 18827857.6, Extended European Search Report mailed Jul. 13, 2020", 6 pgs.
"European Application Serial No. 19830071.7, Extended European Search Report mailed Aug. 16, 2021", 8 pgs.
"International Application Serial No. PCT/US2016/069490, International Preliminary Report on Patentability mailed Jul. 10, 2018", 1 pg.
"International Application Serial No. PCT/US2016/069490, International Search Report mailed Mar. 8, 2017", 2 pgs.
"International Application Serial No. PCT/US2016/069490, Written Opinion mailed Mar. 8, 2017", 7 pgs.
"International Application Serial No. PCT/US2018/040812, International Preliminary Report on Patentability mailed Jan. 16, 2020", 8 pgs.
"International Application Serial No. PCT/US2018/040812, International Search Report mailed Sep. 19, 2018", 2 pgs.
"International Application Serial No. PCT/US2018/040812, Written Opinion mailed Sep. 19, 2018", 6 pgs.
"International Application Serial No. PCT/US2019/040588, International Preliminary Report on Patentability mailed Jan. 14, 2021", 7 pgs.
"International Application Serial No. PCT/US2019/040588, International Search Report mailed Oct. 8, 2019", 2 pgs.
"International Application Serial No. PCT/US2019/040588, Written Opinion mailed Oct. 8, 2019", 5 pgs.
"International Application Serial No. PCT/US2022/078066, International Search Report mailed Feb. 7, 2023", 4 pgs.
"International Application Serial No. PCT/US2022/078066, Written Opinion mailed Feb. 7, 2023", 8 pgs.
Beringer, Robert, "The Measurement of Wavelength—Chapter 5 from Technique of Microwave Measurements", vol. 11 of MIT Radiation Laboratory Series. McGraw-Hill, New York, (1947), 58 pgs.
Gopinath, A., et al., "Capacitance Parameters of Discontinuities in Microstriplines", IEEE Trans. On Microwave Theory and Techniques, vol. MTT-26, No. 10, (Oct. 1978), 831-836.
Mahan, Gerald, et al., "Thermoelectric Materials: New Approaches to an Old Problem", Physics Today, (Mar. 1997), 42-47.
Otoole, Ann, et al., "Thermal mitigation of Pseudomonas aeruginosa biofilms", Biofouling. Sep. 2015; 31(8): 665-675., (2015), 20 pgs.
Richardson, Ian P., et al., "Hemodialysis Catheter Heat Transfer for Biofilm Prevention and Treatment", Asaio J. 2016 ; 62(1): 92-99. doi:10.1097/MAT.0000000000000300, (2016). 17 pgs.
"U.S. Appl. No. 17/444,855, Response filed Nov. 1, 2023 to Non Final Office Action mailed Aug. 1, 2023", 10 pgs.
"U.S. Appl. No. 17/444,855, Final Office Action mailed Nov. 29, 2023", 8 pgs.
"European Application Serial No. 19830071.7, Communication Pursuant to Article 94(3) EPC mailed Jan. 23, 2024", 4 pgs.
"U.S. Appl. No. 17/444,855, Response filed Jan. 26, 2024 to Final Office Action mailed Nov. 29, 2023", 9 pgs.
"U.S. Appl. No. 17/444,855, Notice of Allowance mailed Feb. 16, 2024", 8 pgs.
"U.S. Appl. No. 18/164,087, Non Final Office Action mailed Apr. 3, 2024", 7 pgs.
"International Application Serial No. PCT US2022 078066, International Preliminary Report on Patentability mailed Apr. 25, 2024", 10 pgs.
"U.S. Appl. No. 17/444,855, 312 Amendment filed May 15, 2024", 7 pgs.
"European Application Serial No. 19830071.7, Response filed May 17, 2024 to Communication Pursuant to Article 94(3) EPC mailed Jan. 23, 2024", 19 pgs.
"U.S. Appl. No. 17/444,855, PTO Response to Rule 312 Communication mailed Jun. 3, 2024", 2 pgs.

CONFORMABLE POLYMER FOR FREQUENCY-SELECTABLE HEATING LOCATIONS

CLAIM OF PRIORITY

This patent application is a divisional of Anand Deo U.S. patent application Ser. No. 18/046,414, entitled "CONFORMABLE POLYMER FOR FREQUENCY-SELECTABLE HEATING LOCATIONS," filed on Oct. 13, 2022, which claims the benefit of priority of Anand Deo U.S. Provisional Patent Application Ser. No. 63/262,477, entitled "CONTROLLABLE HEAT GENERATING PLASTIC AND DEVICES AND METHODS FOR MAKING AND USING SAME SUCH AS FOR PROVIDING FREQUENCY-SELECTED HEATING LOCATION ON CONFORMAL PLASTIC FILM," filed on Oct. 13, 2021, which is hereby incorporated by reference herein in its entirety.

CROSS-REFERENCE TO RELATED PATENT DOCUMENTS; INCORPORATION BY REFERENCE

This patent application is also related to, and incorporates by references in their entireties, each of the following documents:

1. U.S. Provisional Patent Application Ser. No. 62/134,875, filed Mar. 18, 2015, entitled Frequency-Controlled Excitation of Semiconductor for Extracting Thermal Energy;
2. U.S. Pat. No. 9,536,758 (application Ser. No. 15/165,096), filed May 26, 2016, entitled Time-Varying Frequency Powered Semiconductor Substrate Heat Source, which issued on Jan. 3, 2017;
3. U.S. Pat. No. 10,431,478 (application Ser. No. 16/200,120), filed Nov. 26, 2018, entitled Time-Varying Frequency Powered Heat Source, which issued on Oct. 1, 2019;
4. U.S. Patent Publication No. 2020-0118846A1 (application Ser. No. 16/548,809), filed Aug. 22, 2019, entitled Time-Varying Frequency Powered Heat Source;
5. PCT Patent Application PCT/US2016/069490, filed Dec. 30, 2016, entitled Time-Varying Frequency Powered Heat Source;
6. U.S. Provisional Patent Application Ser. No. 62/530,035, filed Jul. 7, 2017, entitled Catheter To Inhibit Biofilm Or Infection;
7. U.S. Pat. No. 10,515,831 (application Ser. No. 16/027,139), filed Jul. 3, 2018 entitled Medical Instrument For In Vivo Heat Source;
8. U.S. patent application Ser. No. 16/666,773, filed Oct. 29, 2019, entitled Medical Instrument For In Vivo Heat Source;
9. U.S. Pat. No. 10,553,462 (application Ser. No. 16/502,989), filed Jul. 3, 2019, entitled Planar Transmission Line Resonator Frequency Control of Localized Transducers;
10. PCT Patent Application PCT/US2019/040588, filed Jul. 3, 2019, entitled Planar Transmission Line Resonator Frequency Control of Localized Transducers;
11. U.S. Pat. No. 11,152,232 (application Ser. No. 16/780,554), filed Feb. 3, 2020, entitled Frequency and Phase Controlled Transducers and Sensing; and
12. U.S. patent application Ser. No. 17/444,855, filed Aug. 11, 2021, entitled Frequency and Phase Controlled Transducers and Sensing.

TECHNICAL FIELD

This document pertains generally, but not by way of limitation, to engineered substrate materials for use as a substrate material for generating heat at one or more locations in the substrate that are selectable by selecting or adjusting a frequency of an AC electromagnetic input signal to select a path of signal flow, such as using variable spacing electrodes or a planar resonator structure to selectively address and energize a transducer at a desired location in the substrate along the selected path.

BACKGROUND

Deo U.S. Pat. No. 9,536,758 is directed toward a device for receiving an AC electromagnetic input signal, such as at electrodes having variable spacing therebetween, and, by tuning the frequency of the AC electromagnetic input signal, selecting a particular location within a semiconductor substrate at which the AC electromagnetic input signal is capacitively coupled to the substrate and converted to heat, such as can be used in ice melting, medical device sterilization, or numerous other useful applications.

Deo U.S. Pat. No. 10,553,462 is directed to using a planar transmission line resonator circuit for receiving an AC electromagnetic input signal and, by tuning the frequency of the AC electromagnetic input signal, selecting a particular location within a semiconductor or other substrate at which the AC electromagnetic input signal is capacitively coupled to the substrate and converted to heat.

Stumpf U.S. Pat. No. 8,381,601 is directed toward a transducer system that includes a plurality of transducer elements formed on a flexible substrate with localized circuit elements and interconnects associated with each transducer element.

Rogers et al. U.S. Pat. No. 8,905,772 is directed toward stretchable, foldable, and optionally printable processes for making devices such as semiconductors, electric circuits, and components thereof.

Beuhring et al. U.S. Pat. No. 9,156,228 is directed toward a method for producing a multi-layer plastic film.

Bhattacharjee U.S. Pat. No. 10,326,426 is directed toward a micro-electrical-mechanical system (MEMS) guided wave device that includes a plurality of electrodes arranged below a piezoelectric layer and configured for transduction of a lateral acoustic wave in the piezoelectric layer.

SUMMARY/OVERVIEW

The present inventor has recognized, among other things, the usefulness of systems and devices that can receive an AC electromagnetic input signal and, by establishing, selecting, or tuning the frequency of the AC electromagnetic input signal, selecting a particular location within a substrate at which the AC electromagnetic input signal is converted to heat. The present inventor has also recognized an unmet need for a suitably engineered polymer-based or other material, such as which can be used to efficiently transduce the AC electromagnetic input signal into localized heat in the substrate. Such materials may have one or more other properties that are useful for particular applications, such as conformability, biocompatibility, durability, flexibility, and cost. Because traditionally, plastic and other polymer materials have been used primarily as an insulator of both electricity and heat, there is an unmet need for developing suitable materials for the very different purpose of effectively generating localized heat and heat gradients within a substrate material by establishing, selecting, or tuning the frequency of the AC electromagnetic input signal, such as can be applied to electrodes or a planar resonator structure that can be printed or otherwise formed upon the substrate material.

In overview, the present subject matter can include, among other things, devices, systems, and methods of making and using plastic (e.g., polymeric) compounds such as can act as an active substrate, such as to create heat or provide actuatable transducers. More particularly, localized heat sources or transducers can be formed in the plastic substrate. A plastic material that is configured to provide an active heat source can, for example, provide a heater that can be lighter, substantially immune to rust or corrosion, can be flexible, and can be shapable or conformable, such as to provide a desired shape or to conform to the shape of a desired surface.

The present subject matter can also include, among other things, one or more of: methods for creating a controllable heat generating plastic; a controllable heat generating plastic material or active substrate; a controllable and shapable or conformable heat creating plastic active substrate.

The present subject matter can also include, among other things, producing one or more plastic resin-based compounds such as can be engineered to be capable of localizing heat (e.g., such as having a specifiable thermal conductivity, a low electrical conductivity, a high electrical loss tangent, and, optionally, a high biological compatibility). This can be contrasted with an electromagnetic energy absorbing material that is created with a high loss tangent—but also with higher electrical conductivity. Most such electromagnetic energy absorbing materials would be loaded with magnetic or ferrite metals and designed with an intent to dissipate heat, rather than to localize heat or heat generation.

This Summary/Overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1A:
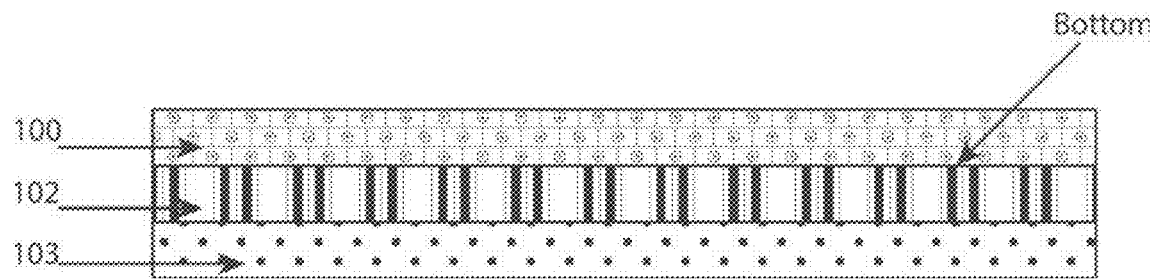
FIG. 1A shows an example of an at least three-layer stacked arrangement of materials for providing a heating device, such as can include a power layer, a coupling layer formed on the power layer, and an active substrate layer that can be formed on the coupling layer.

The present inventor has recognized, among other things, the usefulness of systems and devices that can receive an AC electromagnetic input signal (e.g., sine wave, square wave, or a series of DC pulses issued at a specified "repetition rate" frequency, or other AC electromagnetic input signal). By establishing, selecting, or tuning the frequency of the AC electromagnetic input signal, selecting a particular location within a substrate at which the AC electromagnetic input signal is converted to heat. The present inventor has also recognized an unmet need for a suitably engineered polymer-based or other material, such as which can be used to efficiently transduce the AC electromagnetic input signal into localized heat in the substrate. For example, one approach to providing a material with high electrical conductivity and low loss tangent can include compounding a plastic with a ferroelectric material and one or more additives. Such an approach may be suitable for certain applications in the semiconductor industry, such as in which heat is regarded as waste or an undesirable side effect of a desired electrical or electromagnetic functionality.

This document describes examples of other approaches, such as can include making and using another class of compounds suitable for making one or more of heat creation, control, or localization a primary objective, such as can be desirable for certain other applications. The present approaches can include compounding a polymeric or other plastic material, which can include introducing or loading into the material one or more dopants, such as at a doping concentration level that can be accommodated by a porosity of the plastic material at or less than the porosity threshold of the material. The material composition can be engineered or optimized for one or more particular desired characteristics, such as for providing a greater loss tangent (e.g., tan δ) material property. The loss tangent of a dielectric material quantitatively describes dissipation of electromagnetic energy by the dielectric material as heat. Providing a greater loss tangent (e.g., tan δ) can be desirable for applying an AC electromagnetic input signal to a variable-spacing electrode or planar resonator structure for addressing a particular location at which to permit and provide localized heating and desired operating frequencies and temperatures, such as described in one or more of the patent documents incorporated by reference above. The resulting compounded plastic material can be compounded such as to provide one or more of: a low electrical conductivity and one or more of high thermal retention, high energy conversion to heat, low thermal dispersion, or a prescribed thermal dispersion. Thus, the resulting compounded plastic material can, during manufacture, be engineered or optimized such as to achieve one or more or all of the above-mentioned characteristics (e.g., a low electrical conductivity and one or more of high thermal retention, high energy conversion to heat, low thermal dispersion or a prescribed thermal dispersion). This can be obtained by an appropriate combination of one or more additives with a base resin, such as can be provided during the material compounding process or during another stage of the manufacturing process.

Creating and managing localized heating can include providing one or more thermal cells, arranged or localized at corresponding desired locations in or on a plastic or other substrate. This can have many useful applications. For example, applications can include using localized temperature for releasing different drugs (or different dosages of the same drug) in a particular drug delivery system that releases a drug or a therapeutic agent, with the release based at least in part on the localized temperature being provided. Other examples can include use in one or more of the various applications described in the patent documents that are above incorporated herein by reference.

The material composition can be engineered or optimized for one or more desired characteristics. Examples of such characteristics can include, for example, a desired operating/heating temperature, a melting point of the plastic resin, a desired thermal conductivity, a desired electrical conductivity limit, a desired electrical or thermal power or energy limit, or one or more application-specific boundaries (e.g., one or more of number of localized thermal cells, an amount of energy to be transferred, a duration of thermal exposure, or thermal energy clearance rate).

Examples of particular dopant materials for being introduced into the plastic resin during compounding can include one or more of: barium titanate, gold nanoparticles, silver nanoparticles, titanium oxide nanoparticles, alumina nanoparticles, carbon black, electrically conductive carbon black, or synthetic graphite flakes. Examples of plastic resins with which one or more such dopant materials can be combined can include, for example, polyurethane carbonate aliphatic resin. Using various combinations of the above base materials or dopants, it can be desirable to obtain a resulting doped composite plastic material that can yield a loss tangent of about 0.4, as well as a low thermal conductivity and low electrical conductivity, such as in a flexible conformal plastic film composite material.

The plastic film composite material can be used as a substrate, which can be activated at one or more desired locations, such as can include controlling a frequency of an applied AC electromagnetic signal to establish or select the location of generating heat in the activated substrate and to use this same applied AC electromagnetic signal for activating such location in the substrate for generating heat, such as in a localized manner, or such as to establish a desired heat gradient.

Such a frequency-addressable localized heat source, which can be provided using such a composite plastic film as a substrate, can have many applications. For example, the composite plastic fabric or other film material can be made to conform toward or to the shape of the object that is desired to be heated, or placed in contact with a fluid that is desired to be heated, or included or made into an article of clothing that can heat the wearer, or included in a heatable container, or to provide a hemocompatible and biocompatible component, including such a localized heat source, that can be placed inside of or upon a human or animal.

The techniques described in the above-incorporated patent documents and also described herein can be used together with a composite plastic, such as described herein. The composite plastic material can be used as a composite organic substrate for use in generating frequency-controlled localized heat or heat gradients at one or more desired locations in the activated composite plastic substrate.

In contrast to capacitively coupling an AC electromagnetic input signal into a desired location of a lossy dielectric substrate, when a resistive heating element is placed in a plastic medium under real world conditions in which the goal is to heat a target (for example, if the target to be heated is acting as a coolant such as in the case of a fluid flowing over the heating element), the temperature at the resistive heating element core needs to be much hotter than the desired temperature at the interface of the heating element with the target. But such temperatures may easily reach above the plastic's melting point in such an arrangement of a resistive heating element embedded in a plastic insulator medium. But using the AC frequency-controlled localized heat generation techniques described herein and in the above-incorporated patent documents, the heat can be generated in the composite plastic substrate itself, rather than requiring thermal conduction through an insulating plastic from a much hotter resistive heating element. As such, using the AC frequency-controlled localized heat generation techniques described herein, the temperature of the heat generated by and within the plastic itself can be controlled such that the temperature of the plastic material never reaches a temperature that risks melting the plastic itself, unlike in a plastic-coated resistive heating approach.

In an example, an AC electromagnetic signal can be applied to a planar resonator, and can be used to activate a localized region of a composite plastic substrate, such as described in ones of the above-incorporated patent documents. A layered approach can be used to forming the device, such as to provide resonator and power layers that need not be co-planar. For example, a separate power layer and resonator layer (e.g., separated by a coupling layer and/or an energy transforming layer) can be utilized, such as in addition to or as an alternative to a side-by-side coupling such as shown and described in ones of the above-incorporated patent documents. A single power layer can be provided and used to feed AC electromagnetic energy, applied to the power layer, concurrently to all resonators so that all resonators receive electromagnetic power concurrently. Only those resonators having a resonant frequency that matches the frequency of the applied electromagnetic input signal will resonate and thereby generate heat in the active substrate associated with a particular resonating resonator. Alternatively, the power layer can optionally be patterned into multiple power layer conductors capable of delivering different AC electromagnetic input signals, such as at different applied AC frequencies, to different individual resonators or groups of resonators, which can be configured to resonate at like or different resonant frequencies.

In an example, the heat source can include, or can be made of, multiple layers or several layers. The placement arrangement and interaction between layers can provide a self-contained heat producing device. The heat producing device can receive AC electromagnetic energy as input, and can convert the received AC electromagnetic energy into heat, such as can be generated within the composite plastic substrate material in a manner that is controllable in location of heat generation, quantity of heat generation, or both.

In an example, the heating device can include (or consist of) at least four layers. In an example, such four layers can include: (1) a power layer; (2) a energy coupling layer; (3) a resonator layer; and (4) an active substrate layer. These layers can be arranged upon each other, such as in a vertical stack.

For example, separating the power and resonator layers vertically, e.g., instead of coupling horizontally off a main-line, can help achieve one or more of the following advantages:

1. The manufacturing complexities of placing an electrical conductor upon the substrate in a manner that can provide a tight tolerance and evenness of spacing of the edges of the conductor from edges of another conductor (e.g., for implementing variable electrode spacing or planar resonator features to obtain frequency-controlled localization of heat generation) can be eliminated. Line spacing constraints can be substituted for by layer thickness constraints, which may be more easily controlled during manufacturing. This can allow constructing resonators for providing frequency-controlled localization of heat generation to be created using screen printing, laminating, or other simpler and less expensive and more robust manufacturing process.

2. Providing power to one or more (e.g., an array or group of) resonators or otherwise addressable localized heat generating devices can be easier because of larger surface area available in a cross-section of a power plane layer, as opposed to the more limited cross-sectional surface area available for power provided to a resonator via a main-line strip, rather than via a planar layer.

3. Higher power can be delivered to a desired target region than in a resistive heating approach, because the AC electromagnetic power signal coupled to the heat sources in the composite plastic or other substrate constitute electromagnetic waves that are a surface phenomenon. The penetration of such electromagnetic waves into an electrical conductor is limited to a "skin depth" of the electrical conductor. By keeping the current below one ampere, for example, one can move more power into the overall AC-powered heat generator system than into a comparable resistive heating system. The applied AC electromagnetic input voltage can be high in amplitude, if desired. However, the materials used in constructing the localized heating device can be configured to withstand such higher amplitude applied AC electromagnetic input signal voltages.

To recap, the present techniques can be used to provide a versatile heating film or fabric, such as which can conform to a desired target. The film or fabric can include an organic or composite undoped or doped plastic material that can act as an active substrate to create heat, such as in a localized manner, such as using the techniques described herein and in the patent documents incorporated by reference herein. Such plastic heat sources can help provide several advantages, such as but not limited to low weight and non-corrosive heating devices.

The power layer can accept AC electromagnetic input power. In an example in which the power layer is provided as one unified layer of an electrical conductor, then its entire surface area will contain the electromagnetic field. This electromagnetic field will couple, through the coupling layer, with the structures of the resonators that are placed on the resonator layer. Generally, this can be a capacitive coupling. However, inductive coupling is also feasible. The varying degrees of coupling of the electromagnetic field can create different energy amounts or concentrations in each particular resonator. The energy coupled by a particular resonator is converted to heat in the active substrate, which can be a plastic composite, among other things, such as described or incorporated herein. Any differences in energies of the particular resonators will yield a pattern of similar differences in localized heat generated in the active substrate by the corresponding resonators. Therefore, this can allow one or more thermal gradient patterns to be formed on the surface of the active substrate that spatially resemble corresponding energy patterns among the spatially-distributed resonators.

The power layer can be of a material that is a good electrical conductor, and may span the entire surface area, without requiring patterning into distinct electrically conductive lines or traces. For example, the power layer can include a metallic thin film, such as copper, silver, or the like. No patterning of the electrically conductive power layer is required. However, such patterning of the electrical conductor film can be utilized, such as to project the input electromagnetic energy toward a desired location or to define a path of input electromagnetic energy in the power layer plane. In an example in which a patterning or other technique is used to provide an electrically conductive path (e.g., of the power layer, the resonator layer, or other layer) the location of the resonators in the resonator plane can be arranged such as to receive the electromagnetic energy along a path defined by such patterning.

One or more resonators, such as described or incorporated herein, can be located or otherwise configured such as to help enable creating a differential or a thermal gradient, such as in a predefined or specified pattern. A desired thermal pattern can be also created by input electromagnetic signal power through a meandering transmission line, such as which can be placed or formed on the active substrate. Such a meandering, serpentine, or otherwise defined arrangement of a transmission line need not limit the ability to select between particular locations of heat sources coupled to such a transmission line. In an example, the addressed location of a particular heat source can be fixed by the location of the transmission line, and frequency of the input electromagnetic signal need not be used to select location of heat generation in the manner in which it does in the resonator case. Instead, one or more patterns can be formed by selectively placing one or more transmission lines on the surface and powering each individually.

The coupling layer can be located between the power layer and the resonator layer. The coupling layer can permit the electromagnetic field (generally the orthogonal field, in an example in which the layers are stacked on top each other) to couple with one or more resonators in the resonator layer, such as while providing an electrically insulating layer to inhibit or prevent direct contact and electrical conduction between the power layer and the resonator layer.

The resonator layer can serve to electromagnetically receive power from the power layer, such as can be capacitively or inductively coupled across the coupling layer. Receiving such power at a resonator structure can be individually based on a characteristic resonance of each individual resonator. Thus, by varying the characteristic resonance between individual resonators in an array or other group of individual resonators, locally-variable power input and locally-variable heat creation can be provided across the entire surface across which many individual resonators can be spatially distributed. Shapes and sizes of individual ones of the resonators can be specified depending on the need of a target application.

The active substrate can include a material composition that can be specifically engineered and fabricated to provide a desired active substrate heat generation capability, among other things. Organic polymer plastics are usually poor absorbers of electromagnetic radiation. But by using one or more mixtures or compounding of a polymer plastic base resin, a desired or varying degree of interaction between an electromagnetic field and a composite polymer plastic active substrate can be obtained. For example, barium titanate nanocrystals can be added as dopants to load the base resin to provide a composite polymer plastic material for use as an active substrate layer, such as described or incorporated herein. In a more general example, one or more ferroelectric materials can be used as an additive to a polymer plastic base resin to form a resulting composite polymer plastic material for use as the active substrate layer, such as described or incorporated herein.

Additional loss of electromagnetic energy in the active substrate (e.g., such as for generating responsive heating in the substrate) can be achieved by adding one or more metals to a melted mixture that can include a polyurethane compound or other polymeric plastic resin base, e.g., at or below a percolation threshold. Such "dopant" addition can be carried out such that it does not materially change the thermal conductance of the base plastic. This melted resin mixture can then be converted into flat but conformable film or fabric, such as to provide the active substrate layer of a multi-layer device, such as shown and described and incorporated herein. The active substrate (or one or more locations thereof) can attain different heating temperatures depending on the percentage or other amount of loading or doping of the material with one or more specified dopants. Such doping can be carried out uniformly, variably, or selectively to only certain desired locations. Testing of different substrate material samples can be carried out by exposing the sample to electromagnetic radiation, for example, in a microwave oven operating at 2.4 GHz. The different samples can be placed at approximately the same location in the oven, e.g., about 4.5 inches from the base turntable upon a microwave-safe surface, or on the turntable itself, such as for one minute at the same microwave oven power setting across the different samples.

FIG. 1A shows an example of an at least three-layer arrangement of materials for providing a heating device, such as can include a power layer 103, a coupling layer 102 formed on the power layer, and an active substrate layer 100 that can be formed on the coupling layer. The heating device can receive an AC electromagnetic input signal and, by establishing, selecting, or tuning the frequency of the AC electromagnetic input signal, can be used to select a particular location within a substrate at which the AC electromagnetic input signal is converted to heat. For example, such a three-layer arrangement can include an electrically conductive power layer 103, a dielectric capacitive or coupling layer 102, and an active substrate layer 100, such as which can include a loaded plastic composite or compound material such as described or incorporated herein. The AC electromagnetic input signal can be applied to the electrically conductive power layer 103, which may optionally patterned to electrically conduct the AC electromagnetic input signal to one or more desired locations on the structure of the heating device. Energy from the applied AC electromagnetic input signal can be reactively coupled across the coupling layer 102 and into the active substrate layer 100, within which localized heat sources can be created, such as at a desired location that is selectable by tuning a frequency of the applied AC electromagnetic input signal.

In an example, at the bottom of the active substrate layer 100, at or near its interface with the coupling layer 102, one or more or many resonators can be formed. Alternatively, such resonators can be formed in a separate layer, such as can be located such as to be sandwiched in between the active substrate layer 100 and the coupling layer 102. Such a separate resonator layer may be useful such as when a variation in dielectric constant between the resonator layer and other surrounding layers is used for enabling a desired electromagnetic field concentration in one or more surrounding or nearby layers.

Figure 1B:
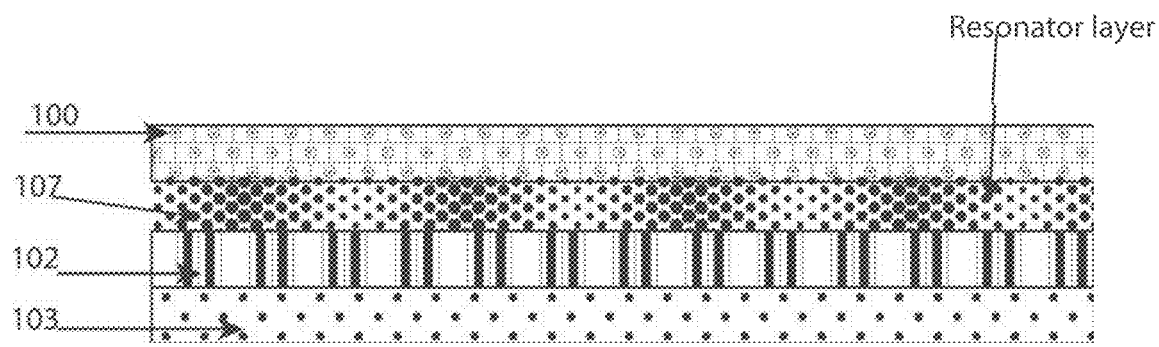
FIG. 1B shows an example of a cross-sectional side view, similar to FIG. 1A, but showing an example of a separate resonator layer, such as can be located in the stacked arrangement of layers of the heating device, such as between the active substrate layer and the coupling layer, and such as can be used throughout the various examples, if desired.

FIG. 1B shows an example of a cross-sectional side view, similar to FIG. 1A, but showing an example of a separate resonator layer 107, such as can be located in the stacked arrangement of layers, such as between the active substrate layer 100 and the coupling layer 102, and such as can be used throughout the various examples, if desired. The resonator layer 107 can be patterned and used to form a plurality of planar resonators, which can be configured to be capable of being respectively addressed, for example, individually or in one or more groups, such as by establishing or tuning the frequency of the applied AC electromagnetic input signal. In this way, one or more locations within the active substrate 100 layer that are adjacent or near a particular planar resonator formed in the resonator layer 107 can be actuated to generate heat within the active substrate 100 in response to a particular planar resonator in the planar resonator layer 107 being addressed by the particular frequency of the applied AC electromagnetic input signal.

Figure 1C:
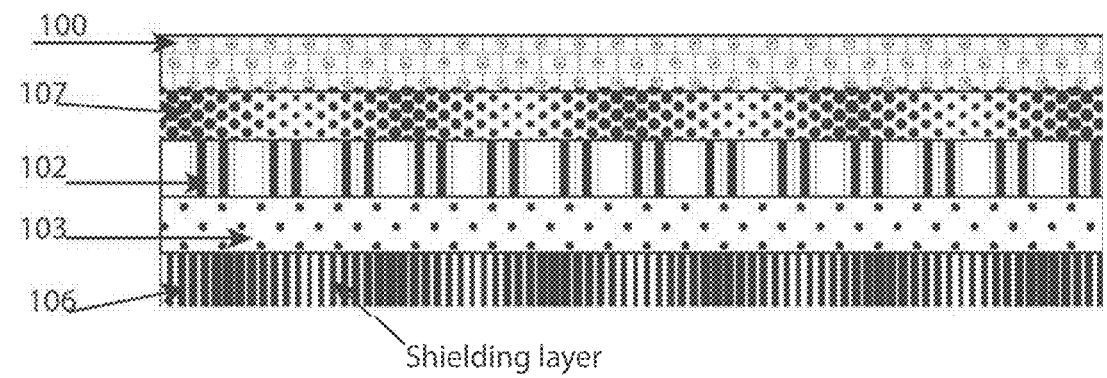
FIG. 1C shows an example of a cross-sectional side view, similar to that shown in FIGS. 1A-1B, of an example of a multi-layer stack that can include an optional shielding layer.

FIG. 1C shows an example of a cross-sectional side view, similar to that shown in FIGS. 1A-1B, of an example of a multi-layer stack that can include an optional shielding layer 106, which can be formed adjacent to the power layer 103, such as shown, or instead adjacent to any of the other layers, if desired. The shielding layer 106 can be formed using a metallic or other material that is electrically conductive. The electrically conductive shielding layer 106 can be electrically connected to a ground (or other stable reference potential node), such as to provide a Faraday shield or cage that can shield objects beyond the shielding layer 106 from noise or energy, such as that associated with the AC electromagnetic input signal being applied to the power layer 102. Such shielding can help avoid electromagnetic interference (EMI) or other noise effects on any other nearby instrumentation, as well as helping reduce or avoid the presence of stray electromagnetic fields being present at locations other than those locations intended for use in generating heat in the active substrate 100.

Figure 1D:
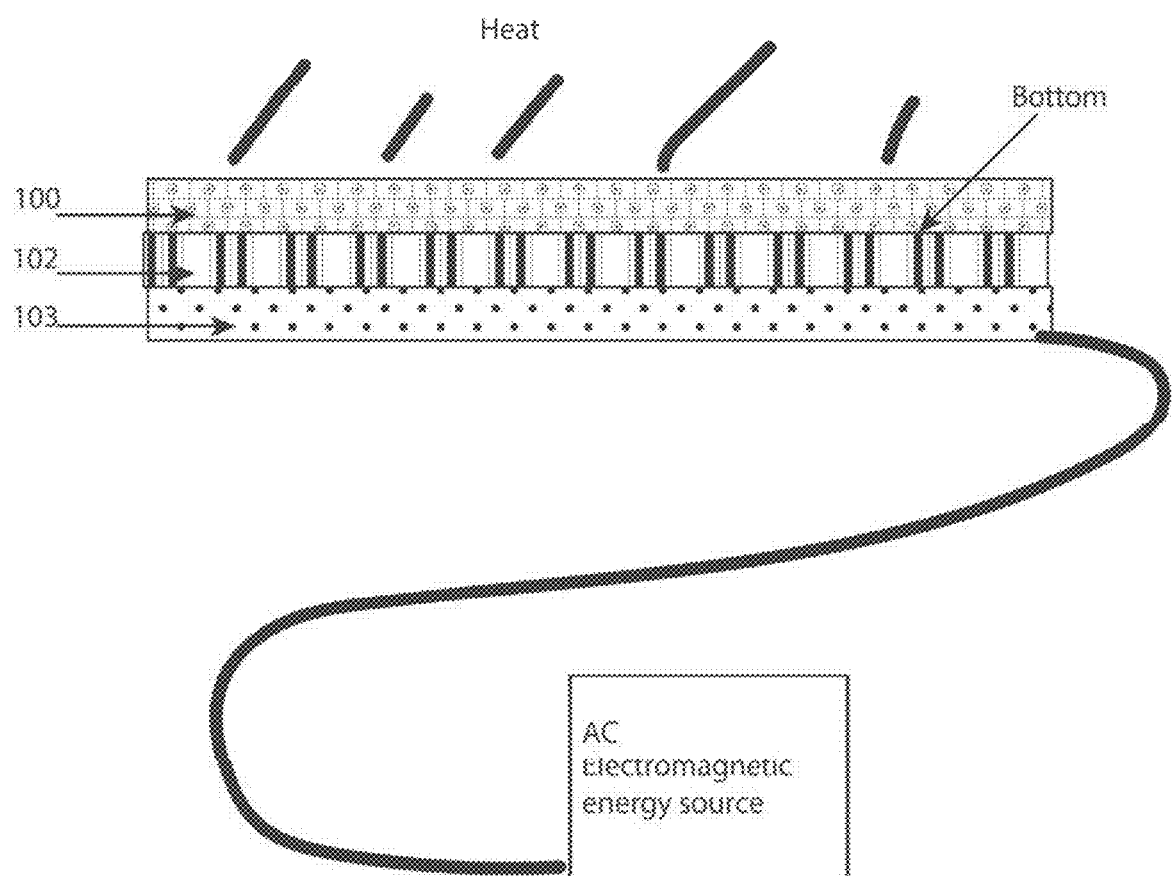
FIG. 1D shows an example of a cross-sectional side view of an example of a stacked layer arrangement for a heating device, showing electromagnetic power being input, such as from an AC electromagnetic energy source, such as which can be electrically connected to an input terminal associated with the power layer of the layered stack.

FIG. 1D shows an example of a cross-sectional side view of an example of a stacked layer arrangement for a heating device, showing electromagnetic power being input, such as from an AC electromagnetic energy source, for example, such as which can be electrically connected to an input terminal associated with the power layer 103 or to one or more individual electrical conductors that are patterned within the power layer 103. By tuning the frequency of the applied AC electromagnetic input signal applied to the power layer 103, one or more particular resonators, variable spacing electrode structures, or other location-selective structures can be addressed to select the one or more particular locations of the active substrate 100 to be actuated and energized for generating a corresponding one or more localized heat sources. Such addressing can be carried out by tuning the frequency of one or more applied AC electromagnetic input signals-without requiring any switches, multiplexors, or the like to route the AC electromagnetic input signal to a desired resonator or other structure to be actuated. This does not mean that one or more such switches, multiplexors, or like electronic components cannot be included, if desired, to provide additional control or functionality. However, such switches, multiplexors, or like electronic components need not be used to route the applied AC electromagnetic input signal to the desired locations, since tuning the frequency of the applied AC electromagnetic input signal can be used to selectively address one or more resonators or other structures that can be configured to be responsive to a particular frequency of the applied AC electromagnetic input signal, such as with different resonators responsive to different such frequencies to allow selective addressing of some but not all resonators in the structure.

Figure 1E:
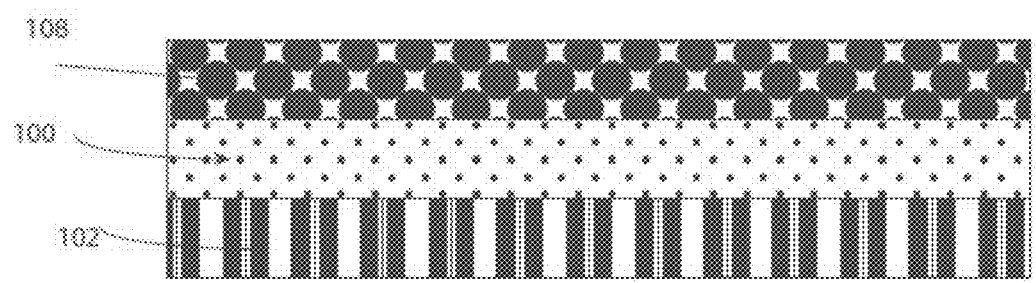
FIG. 1E shows an example of a cross-sectional side view of an example of a stacked layer arrangement for a heating device, similar to FIGS. 1A-1D, showing a polymeric or other active substrate layer, an electrically conductive ground plane, and a planar resonator layer.

FIG. 1E shows an example of a cross-sectional side view of an example of a stacked layer arrangement for a heating device, similar to FIGS. 1A-1D, showing a polymeric or other active substrate layer 100, an electrically conductive ground plane 108, and a planar resonator layer 102. The active substrate layer 100 can include a bilayer or other multi-layer active substrate arrangement. For example, the active substrate layer 100 can include a carbon-doped electromagnetic energy absorbing layer that is closer to the ground plane 108 and a barium-titanate doped electromagnetic energy coupling or focusing layer that is closer to the resonator layer 102, such as described elsewhere herein. The electrically conductive ground plane 108 can optionally be electrically connected to an electrical ground node of the heating device. The resonator can include any of a variety of planar resonator structures that can be tuned to resonate at like or different frequencies, in response to an applied AC electromagnetic input signal.

Figure 1F:
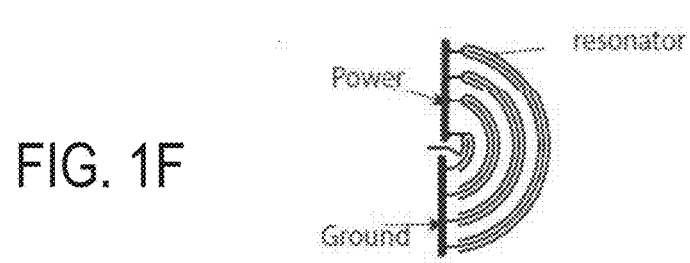
FIG. 1F is a top view showing an illustrative example of electrically conductive power, ground, and resonator traces, such as can be screen-printed or otherwise deposited onto a shared layer of the stacked heating or other transducer device

FIG. 1F is a top view showing an illustrative example of electrically conductive power, ground, and resonator traces, such as can be screen-printed or otherwise deposited onto a shared layer of the stacked heating or other transducer device for being selectively addressed by tuning the frequency of an applied electromagnetic input signal that can be applied to the resonator trace. The power, ground, and resonator traces shown in FIG. 15 can be formed in the resonator layer 102 shown in FIG. 1E, so as to be adjacent to the active substrate layer 100, for example, such as to be adjacent to the barium titanate doped electromagnetic energy coupling or focusing portion of the active substrate layer 100.

Figure 2:
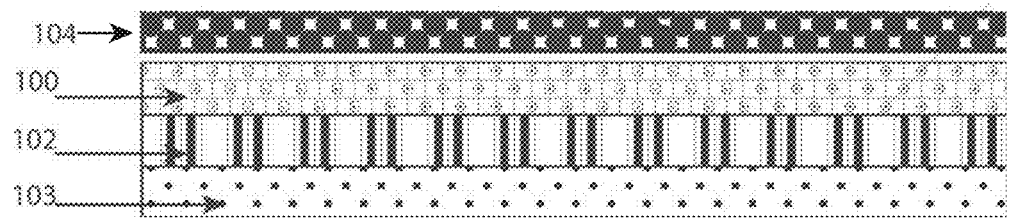
FIG. 2 shows a cross-sectional side view of an example of a layered stack arrangement, similar to those illustrated in FIGS. 1A, 1B, 1C, and 1D, but also including an optional sensor layer within which one or more temperature or other sensors can be included, such as to permit closed-loop feedback of one or more heating locations of the heating device to control the temperature measured at or near one or more such heating locations or to control the amount of heat generated.

FIG. 2 shows a cross-sectional side view of an example of an arrangement, similar to those illustrated in FIGS. 1A, 1, 1C, and 1D, but also including an optional sensor layer 104. In FIG. 2, the sensor layer 104 can be used for implementing a thermocouple or other temperature sensor. The temperature sensor can be used for performing temperature or other sensing. Such temperature or other sensing can be used for providing closed-loop control of the heating, for example. In FIG. 2, temperature or other sensing can be carried out using a thermocouple or other temperature sensing device located in the sensor layer 104, such as can be superjacent to the active substrate layer 100. Temperature or other sensing can however be performed at any desired location or within a particular layer or in between two of the layers, such as by arranging the sensor layer 104 accordingly as desired.

Figure 3:
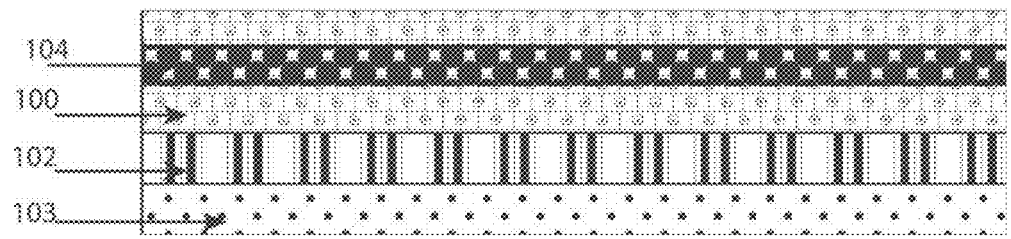
FIG. 3 shows a cross-sectional side view of an example of a sensor layer being included within the stacked layers, such as within or adjacent to the active substrate layer.

FIG. 3 shows a cross-sectional side view, similar to that shown in FIG. 2, of an example of the sensor layer 104 being embedded within the stacked layers, such as within or adjacent to the active substrate layer 100. The location and nature of sensing using the sensor layer 104 can be driven by a particular application or particular needs of a control system, such as for controlling localized heat generation or delivery. For example, the sensor layer 104 can include one or more thermocouples, thermistors, or other temperature sensors that can feed sensor data to a control system, such as to control initiating one or more actions, such as initiating, adjusting, or terminating electromagnetic energy delivery to one or more of the localized heat transducers generating heat at a corresponding location in the active substrate layer 100.

Figure 4:
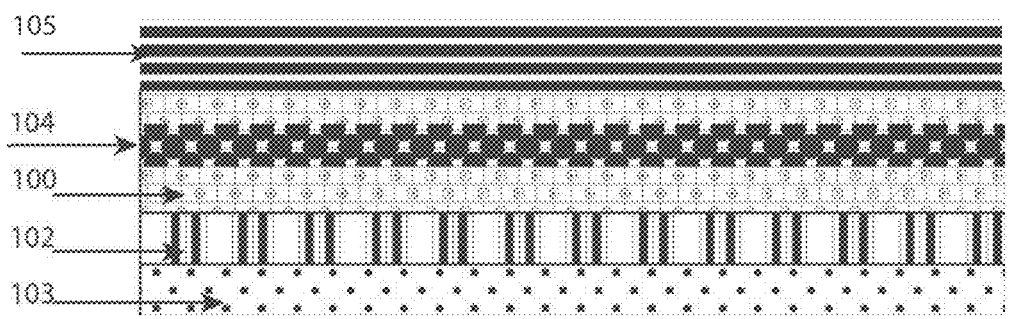
FIG. 4 shows a cross-sectional side view of an example of a stacked arrangement including a heating target interface layer.

FIG. 4 shows a cross-sectional side view of an example of a heating target interface layer 105. The heating target interface layer 105 can be located at the edge of the heating device facing toward a target to be heated. For example, the heating target interface layer 105 can be adapted for making conformal or other physical contact with the target to be heated. For example, the interface layer 105 can include a fabric, such as in a heated garment or clothing item application. In another example, such as for an external or in vivo human or animal target to be heated, the target interface layer 105 can include a hemocompatible or biocompatible target interface layer 105, such as to provide suitable contact with a desired portion of a human or animal body. In some cases, the target interface layer 105 can be configured to act as a barrier, such as when the environment in contact with the interface layer 105 is challenging or even hostile, such as in the presence of a toxic chemical substance, as an illustrative example. The interface layer 105 can function as a protective layer to the heating device including any of the arrangements of layers such as shown or described or incorporated herein. The interface layer 105 can include an adhesive material, such as to conformally or otherwise adhere the heating device to the desired target to be heated. The interface layer 105 can include a shielding layer, such as to shield the desired target to be heated from electromagnetic fields, interference, or noise that may otherwise cause unwanted effect or behavior at the target object to be heated.

Figure 5:
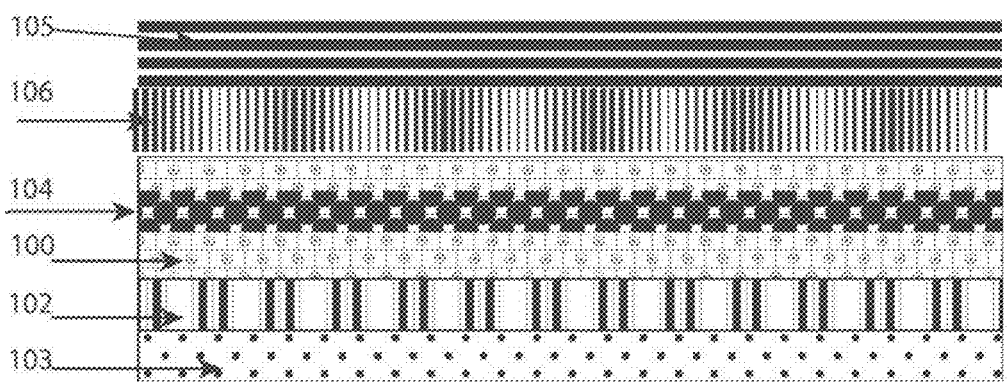
FIG. 5 shows a cross-sectional side view of a further example of a layered stack heating device, such as which can include a shielding layer.

FIG. 5 shows a cross-sectional side view of a further example of a layered stack heating device, such as which can include a shielding layer 106. The shielding layer 106 can be located between the active layer 100 and the interface layer 105. The shielding layer 106 can include an electrically conductive shielding layer 106 such as to help serve to shield the interface between the interface layer 105 and the target object or environment from radiative electromagnetic energy leakage from the active substrate 100 into the target object or environment.

Figure 6:
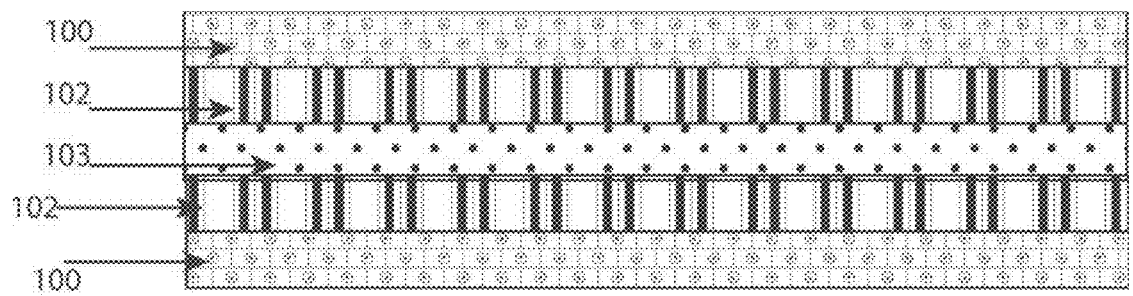
FIG. 6 shows a cross-sectional side view of an example in which a power layer can be sandwiched between two similar sets of (1) a coupling layer and (2) an active substrate layer, such as to provide a double-sided heat creation.

FIG. 6 shows a cross-sectional side view of an example in which the power layer 103 can be sandwiched between two similar sets of (1) a coupling layer 102 and (2) an active substrate layer 100, such as shown or described or incorporated herein. Such an arrangement such as shown in FIG. 6 can help enable or provide concurrent double-sided heat creation, such as at opposing sides of a planar heating device that can include a stacked layer arrangement. Such an arrangement may include one or more other layers, such as described in the various other examples provided herein.

Figure 7:
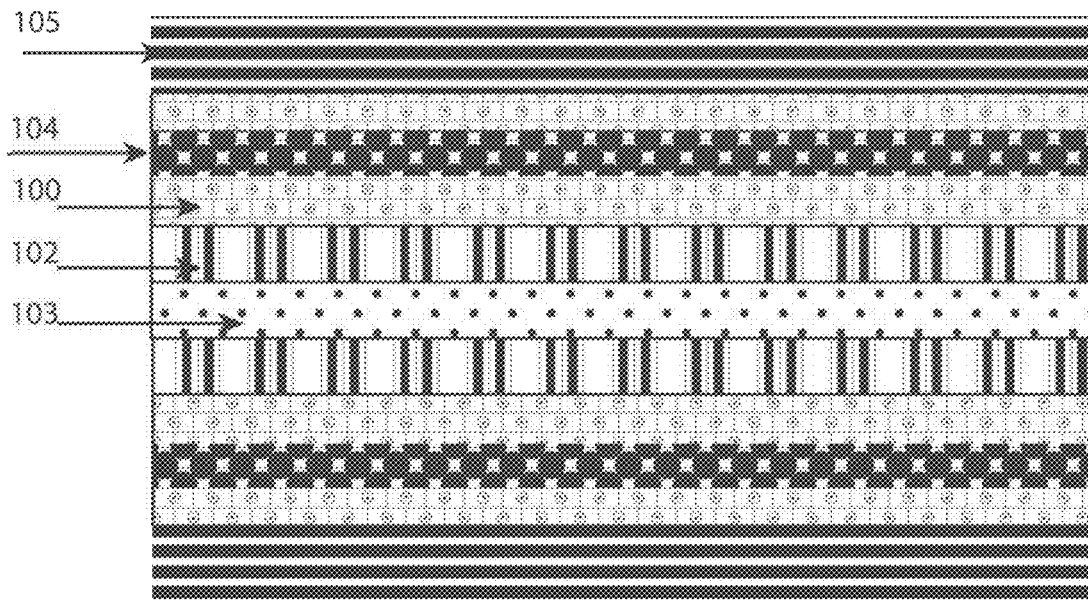
FIG. 7 shows a cross-sectional side view of an example of a double-sided heating arrangement of layers, such as shown in FIG. 6, but also including a double-side arrangement of a sensor layer and the interface layer.

FIG. 7 shows a cross-sectional side view of an example of a double-sided heating arrangement of layers, such as shown in FIG. 6, but also including a double-side arrangement of a sensor layer 104 and an interface layer 105.

Figure 8:
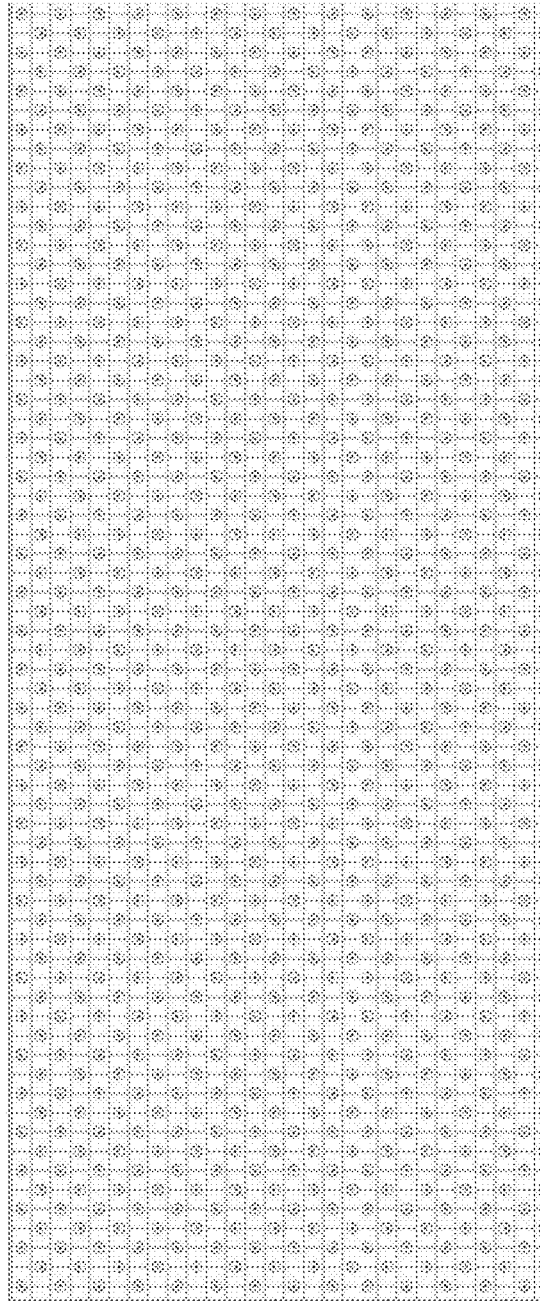
FIG. 8 shows a deconstructed top or bottom view of an example of a single complete base or power layer.

FIG. 8 shows a deconstructed top or bottom view of an example of a single complete base or power layer 103, such as can be included in a layered stack arrangement, examples of which are shown herein in various other FIGS. In FIG. 8, the entire planar electrically conductive rectangular power layer 103 can be powered by an AC electromagnetic signal that can be electrically coupled thereto. However, it is not necessary to have the electrically conductive power layer 103 arranged as a single contiguous sheet power layer 103. Instead, the power layer 103 may be selectively patterned or formed, such as with one or more electrically conductive regions being electrically isolated from one or more other electrically conductive regions within the power layer 103, such as patterned or otherwise arranged as desired for the particular application.

However, such patterning of the power layer 103 is not required, and such patterning can instead generally be provided via one or more selectively patterned resonators (e.g., such as within a resonator layer 107), such as which can be electrically coupled to the power layer 103 to receive AC electromagnetic energy as an input signal to the one or more resonators. Regardless of whether the power layer 103 is patterned or instead the resonators are patterned and deposited or otherwise formed upon the power layer 103 or another layer, one or more spatial, temporal, or spatiotemporal power patterns can be provided, such as to provide different power to different regions, which can be used to help further select the concentration of power to be applied via the resonators, such as to generate a desired amount of heat at desired localized regions.

As shown and explained elsewhere herein, one or more ground planes can be placed in the layered stack as an independent layer, for example, separated from one or more other layers in the stack by an electrically insulating or a capacitive dielectric coupling layer. For efficiency of stack thickness of the device, one or more electrically conductive ground planes or traces may be included in a planar layer in a pattern that can be intermixed with the power and resonator electrically conductive trace patterns, such as shown in the illustrative example of FIG. 1F. one or more electrically conductive ground traces can be spaced appropriately to permit electromagnetic coupling between the power/resonator electrical trace and the ground trace within the patterned resonator and power structure.

Figure 9:
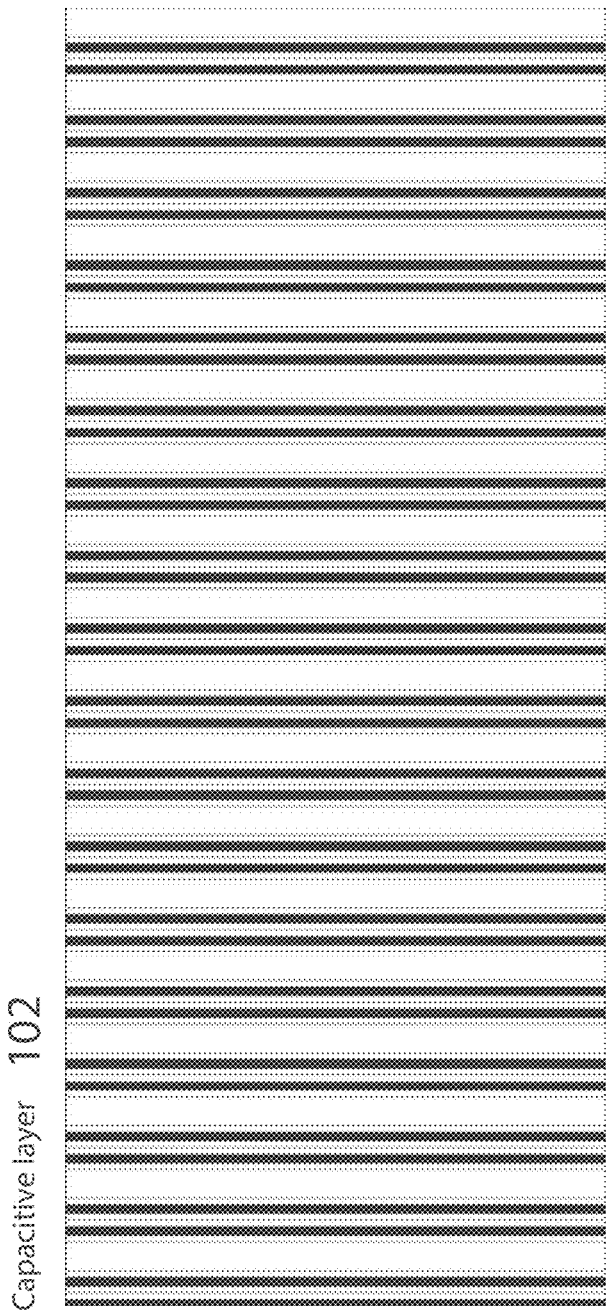
FIG. 9 shows an example of a deconstructed top or bottom view of an example of the capacitive or coupling layer.

FIG. 9 shows an example of a deconstructed top or bottom view of an example of the capacitive or coupling layer 102, such as can be included in a layered stack arrangement of a heating device. The coupling layer 102 can include or be made of a high dielectric constant or other electrically insulating dielectric material, such as to permit capacitive coupling of the applied AC electromagnetic input signal across the coupling layer 102, e.g., from the power layer 103 to the active substrate layer 100. The thickness of the coupling layer 102 can be specified to be thin enough to permit the desired capacitive coupling, but thick enough to withstand an dielectric degradation or dielectric breakdown that may otherwise result from applying the AC electromagnetic input signal to the power layer 103 that is located adjacent to the coupling layer 102.

Figure 10:
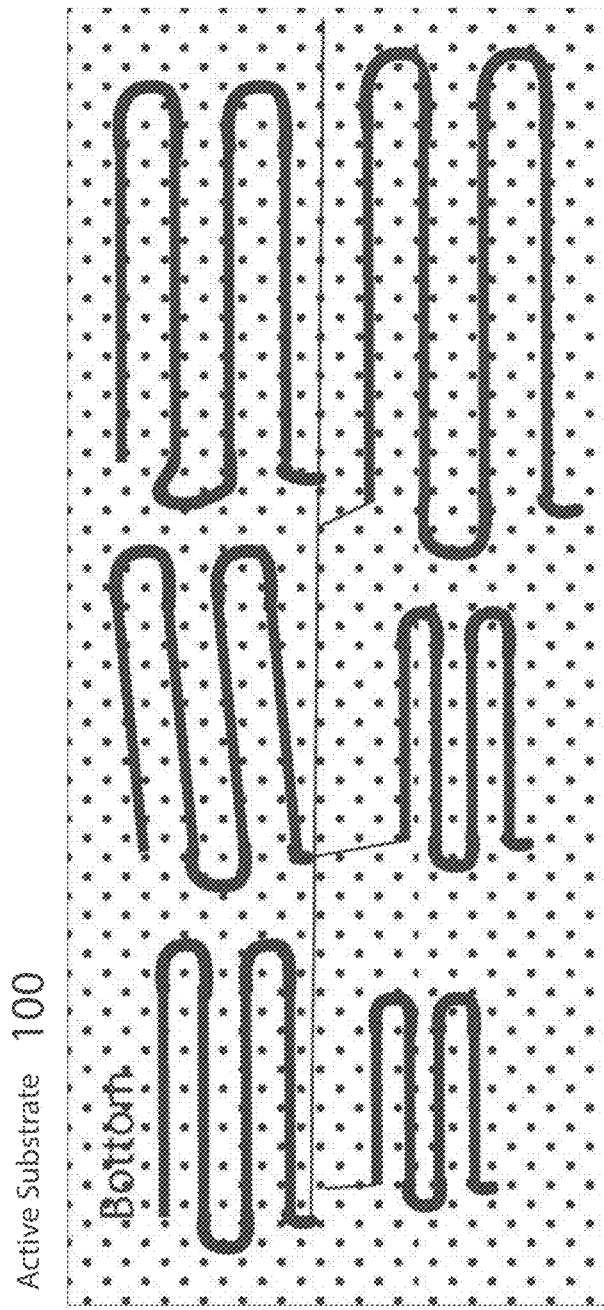
FIG. 10 shows a deconstructed top or bottom view of an example of the active substrate layer with selectively patterned individual electrically conductive resonators formed upon the bottom of the active substrate layer.

FIG. 10 shows a deconstructed top or bottom view of an example of the active substrate layer 100 with selectively patterned individual electrically conductive resonators formed upon the bottom of the active substrate layer 100. The active substrate layer 100 can include a doped or loaded plastic material, such as described herein. The selectively patterned individual electrically conductive resonators can be selectively deposited or can be uniformly deposited and selectively etched to provide the desired pattern of electrically conductive resonator structures. For example, a photolithographic or screen printing or other process may be used to selectively form individual resonator structures, variable spacing electrode structures, or other suitable structures for allowing selective addressing of locations within the active substrate 100 for generating heat.

Figure 11:
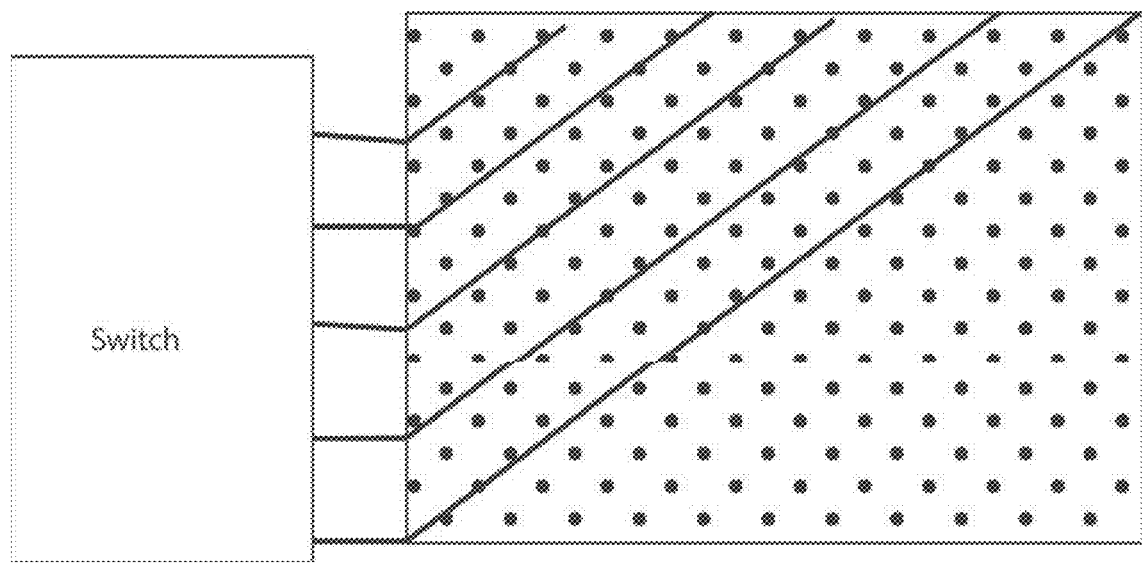
FIG. 11 shows an example of a pattern of individual transmission lines such as can be placed directly on the active substrate layer to provide electrical conduction pathways of the input AC electromagnetic energy to certain spatially distributed desired resonator or other locations within the active substrate layer at which heat is to be generated within the active substrate layer.

FIG. 11 shows an example of a pattern of individual transmission lines such as can be placed directly on the active substrate layer 100, such as to provide electrical conduction pathways of the input AC electromagnetic energy to certain spatially distributed desired resonator or other locations within the active substrate layer 100 at which heat is to be generated within the active substrate layer 100. The particular locations within the active substrate layer 100 to be energized can be selected by establishing or adjusting a frequency of the input AC electromagnetic energy signal, such as using the planar resonator or variable electrode spacing structures described or incorporated herein to select the corresponding locus or loci of energization within the active substrate layer 100.

Figure 12:
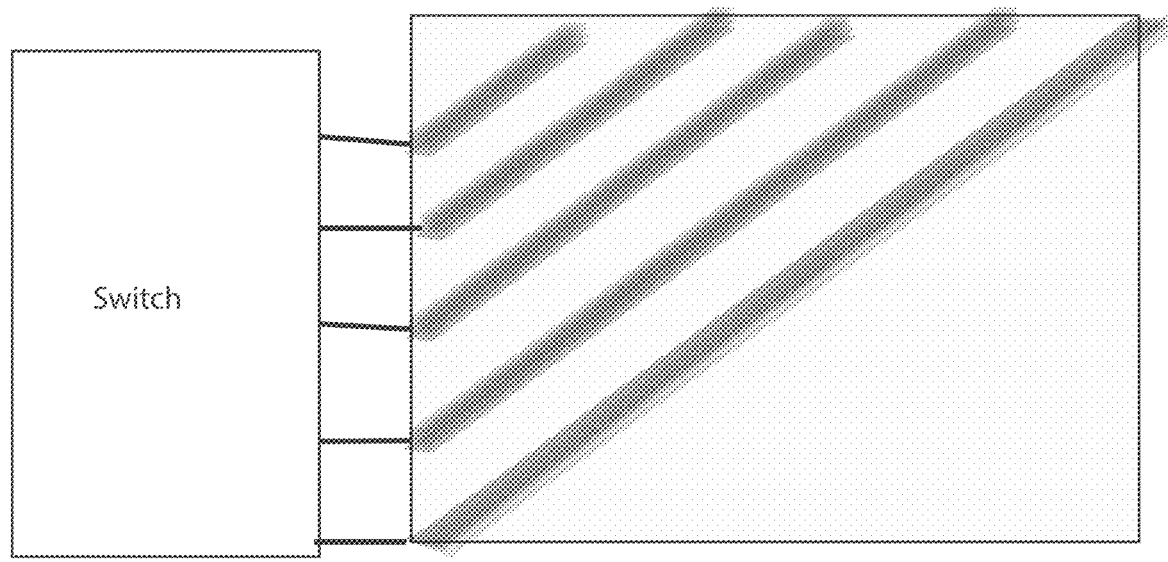
FIG. 12 shows an illustrative conceptualized (not real data) of an example of a pattern of heat created in the active substrate layer, such as where the generated heat follows along the paths of the transmission lines shown in FIG. 11 that are tuned to receive such frequency of the AC electromagnetic input signal.

FIG. 12 shows an illustrative conceptualized (not real data) of an example of a pattern of heat created in the active substrate layer 100. The example of FIG. 12 shows a pattern in which the generated heat follows along the paths of the transmission lines shown in FIG. 11 when all such transmission lines are concurrently fed an AC electromagnetic input signal that has been tuned to a frequency for which corresponding resonators are configured to receive and resonate. One or more switches can optionally be included and optionally used such as to help select which particular transmission line is powered, when desired. However, as explained elsewhere herein, such switches, multiplexors, or other routing electronics are not required because the frequency of the AC electromagnetic input signal can be established or tuned to select which particular transmission line resonator structures respond to that particular frequency of the AC electromagnetic input signal by resonating and activating corresponding locations in the active substrate 100 for localized heat generation at such activated corresponding locations in the active substrate 100.

Materials

Plastics and other polymers can be created and modified by compounding. Such compounding can include doping, loading, or otherwise introducing one or more additives to one or more base resins. One or more additives can be selected such as to obtain one or more specific properties such as may be desired for a particular application or use case. For the present application, it can be desirable to create a plastic or polymer substrate that includes one or more materials that can efficiently convert AC electromagnetic input energy into localized heat that can be generated within the substrate. The material should also be able to withstand the created heat, such as without melting the substrate material. Other desirable properties of the material can include, for example, a flexible conformable substrate, such as which can be placed in contact against—or even adhered or affixed to—a target object to be heated. For such an application, it can be desirable to dope a base plastic material, such as polyurethane, with an electromagnetic energy absorbing additive, such as carbon. For such an application, it can also be desirable to dope the base plastic material, such as polyurethane, with an energy focusing additive, such as barium titanate.

Forming a desired plastic material by compounding can present certain challenges. First, it may not be possible to differentiate the functional properties of each one of multiple additives being compounded with the base plastic material. Stated differently, compounding multiple additives with a base plastic may not obtain the desired functional properties of a particular additive due to the presence of one or more other additives also being compounded. The properties of a particular additive may affect the properties of one or more other particular additives. The challenge of differentiating functional properties of different additives being introduced into the base plastic resin may be difficult to overcome, even with a multi-step compounding process that attempts to individually exploit respective properties of individual additives. Second, compounding creates an optimization challenge, such as between desired material physical properties, desired material electromagnetic properties, and heat source transducer characteristics. For example, the percentage of polyurethane base material needs to be as high as possible to retain its material properties, such as flexibility, stretchability, biocompatibility, among others. The amount of barium titanate additive needs to be much higher than the amount of carbon additive, such as to enable focusing of electromagnetic energy to be prominent in a compounded material, such as to provide good localization of heat generation in the resulting compounded active substrate material. On the other hand, having a greater percentage of carbon added into the compounded material is beneficial for providing good electromagnetic energy absorption or heat source transduction efficiency.

Layering different compounded materials can help reduce or even eliminate the above challenges. By forming an active substrate structure using a layered material, an individual layer in a layered stack can be formed of a material having properties that are particular to that layer, which need not be affected by properties of one or more other layers in the stack. Thus, forming a layered stack of different materials can permit independent adjustment or maximization of (1) electromagnetic energy focusing and (2) electromagnetic energy absorption characteristics, without reducing or affecting the fundamental desired characteristics of the polyurethane or other base material. In a layered stack arrangement, the AC electromagnetic input energy can be fed first through a layer of the electromagnetic energy focusing material, then into a layer of the electromagnetic energy absorption material. In such a layered stack arrangement, the electromagnetic energy absorption spectrum can be configured to have a single prominent peak in the electromagnetic energy absorption material layer, at which the electromagnetic energy loss (resulting in generated heat) is much greater than in a compounded single layer active substrate. Thus, a stack of layers of different materials can provide a more efficient heat source device, such as in applications in which focusing is desired for the transduction of electromagnetic energy into heat. The different layers can beneficially provide a multi-step process of energy transformation in the layered material stack.

Before transduction into heat, the electromagnetic energy can be transformed in time and space, such as can be helpful for a particular application. For example, focusing and timing of electromagnetic energy, such as to meet a transduction threshold, can be helpful in certain applications.

In an illustrative example, a bilayer polyurethane substrate can be manufactured, such as in which barium titanate and activated carbon nanoparticles are respectively used as additives for the two different material layers. Barium titanate can be added to a first layer, which can serve as an electromagnetic energy "focusing" layer. Activated carbon can be added to a second layer, which can serve as an energy dissipation layer in which the electromagnetic energy is converted into heat. Each layer can be formed by its own compound first, and then the different layers can be assembled into a stack of these layers to form a bilayer stack active substrate.

The goal of concentrating energy (low Q) can be in conflict with the goal of dissipating energy (high Q) for generating localized heat. Because, to dissipate electromagnetic energy, a "lossy" dielectric material is needed. Such a lossy dielectric material can have a broader quality factor (Q) than a less lossy dielectric material. The broader Q of a lossy dielectric material, in turn, can cause the electromagnetic energy to lose spatial and frequency focus. For device operating efficiency, a narrow Q is preferable, which yields better spatially and frequency focused electromagnetic energy. Focusing occurs in frequency domain as well as in space. Frequency focus enables providing many more independently frequency addressable points at corresponding specifiable addressing frequencies. This is because the frequency spread between two independently addressable frequency locations is reduced when narrow Q is available. Thus, the narrow Q in the frequency domain permits concentrating energy in a narrow area in space, such as by providing correspondingly addressable resonators for receiving AC electromagnetic energy and resonating at well defined (narrow Q) resonance frequencies. Therefore, narrow Q enables spatial focusing of energy to occur too. This can have significant implications because the spacing between two spectral frequency peaks can impact operating frequency bandwidth between two neighboring transducers. Sharper focus and greater concentration of energy results in greater device efficiency.

Figure 13:
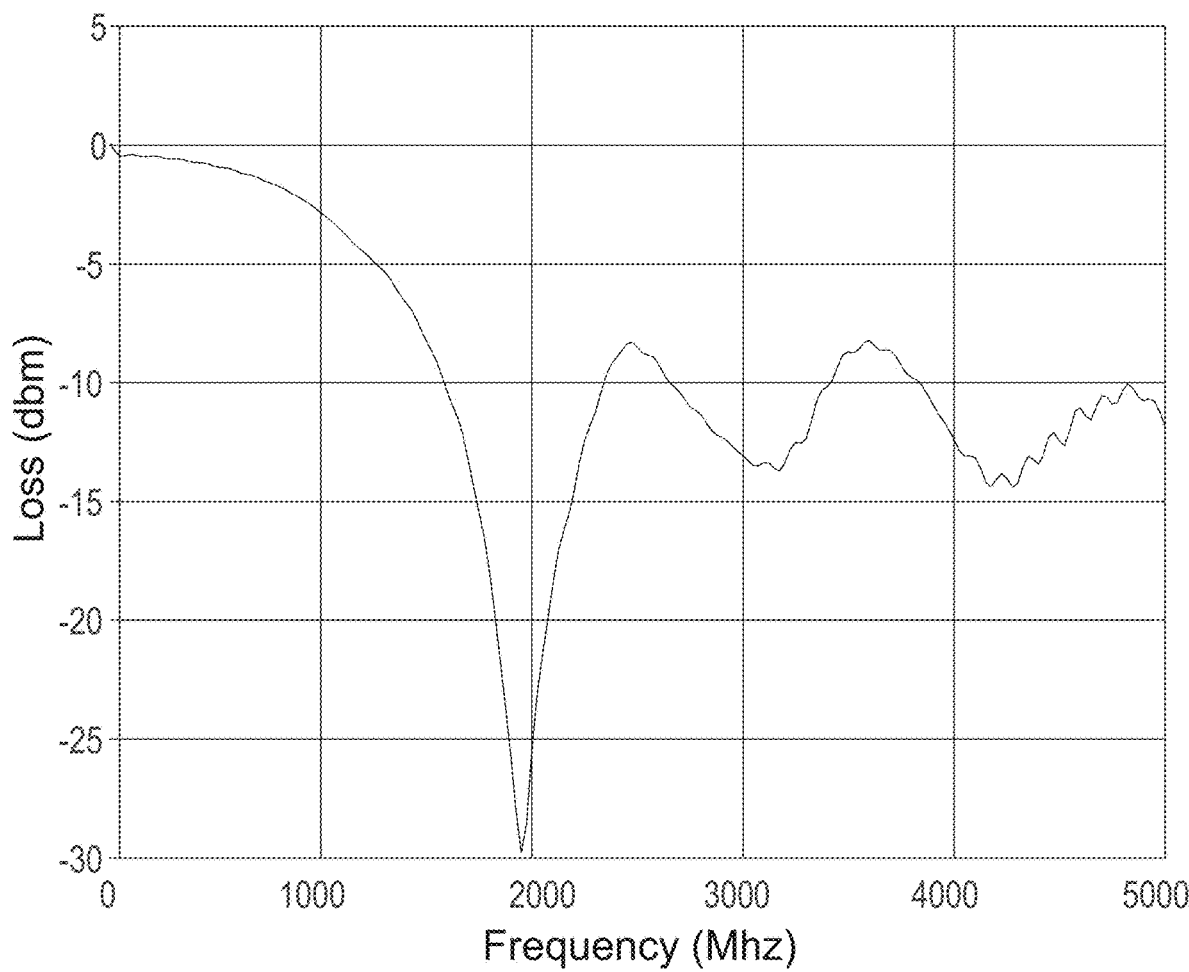
FIG. 13 shows a spectral graph of loss (dBm) vs. frequency (MHz) for a particular illustrative example from an experiment in which Carbon is added to Polyurethane in an amount that is 40% by weight.

FIG. 13 shows a spectral graph of loss (dBm) vs. frequency (MHz) for a particular illustrative example. In this example, each material sample was placed on a 2.4 GHz strip antenna, with all other surroundings held constant. A zero-effect block was placed on top of the sample, upon which a weight was placed to keep the sample steady in place upon the antenna. A Keysight vector network analyzer was used to generate the spectrum data shown in the figures.

FIG. 13 shows an example of a resulting spectrum from an experiment in which Carbon is added to Polyurethane in an amount that is 40% by weight. With such a material composition of the sample, the peak loss (minima) is located just below 2.0 GHz, and the other losses in this spectrum are greater and flatter with close to a −10 dbm loss other than at the peak loss minima that is just below 2.0 GHz.

Figure 14:
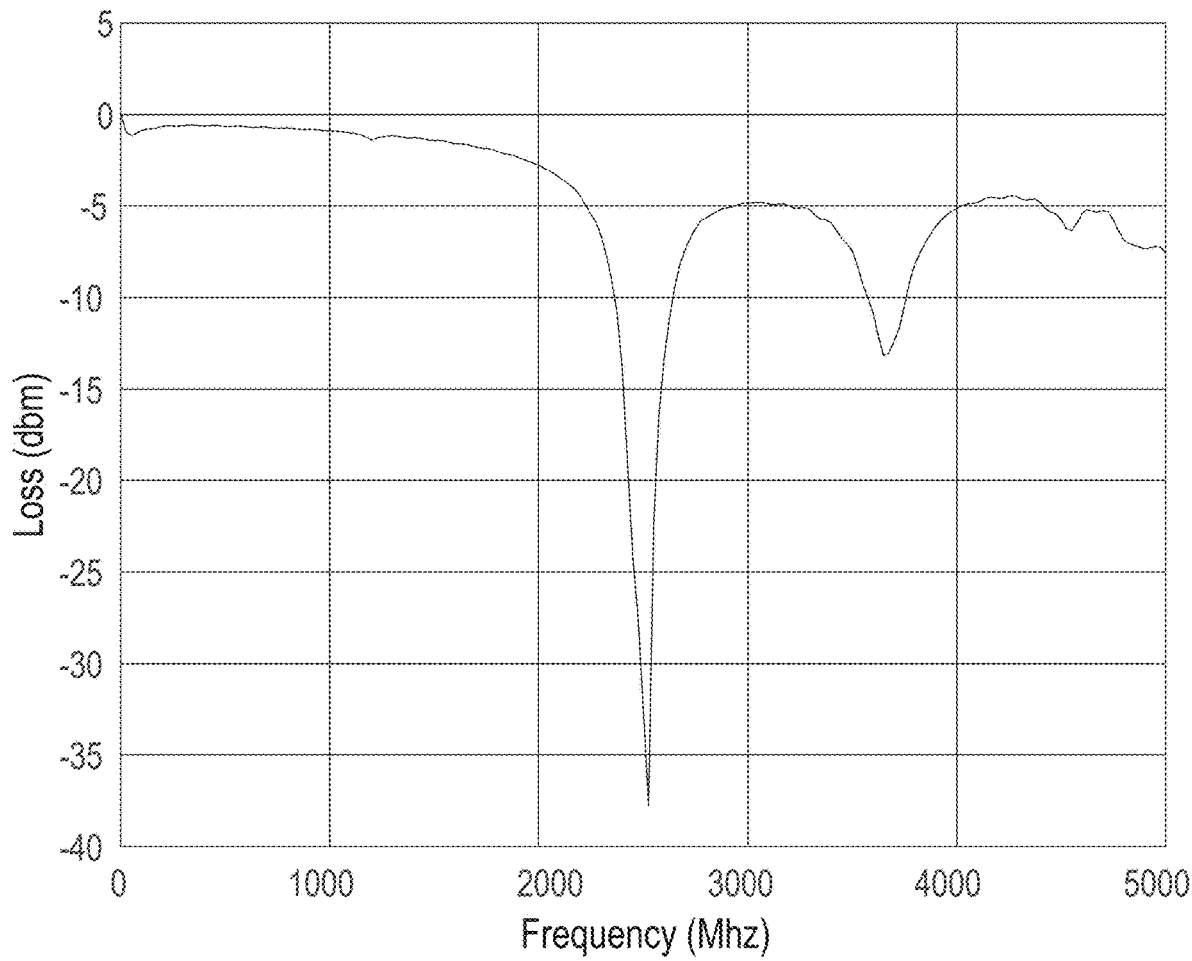
FIG. 14 shows an experimental spectral graph of loss (dBm) vs. frequency (MHz) for a particular illustrative example in a bi-layer configuration, with a first layer of carbon added to polyurethane at 40% carbon by weight, and with a second layer of barium titanate added to polyurethane at 20% barium titanate by weight.

FIG. 14 shows an experimental spectral graph of loss (dBm) vs. frequency (MHz) for a particular illustrative example in a bi-layer configuration, with a first layer of carbon added to polyurethane at 40% carbon by weight, and with a second layer of barium titanate added to polyurethane at 20% barium titanate by weight. In the example of FIG. 14, the peak loss minima is located close to 2.4 GHz, Q has increased in FIG. 14 relative to FIG. 13, and the loss remained the same relative to FIG. 13. The narrower Q and similar lossiness of FIG. 14 relative to the example of FIG. 13 can be very a desirable outcome, since it permits addressing and actuation of the heating device at a single well-defined narrow frequency band (close to 2.4 GHz) without reducing the lossiness that is obtained, thereby giving good heat transduction performance. Instead of a bi-layer, one can optionally add several layers. Each layer can be configured to perform a specific function or transformation of the applied AC electromagnetic signal. As the electromagnetic signal flows through the substrate layers and finally reaches the electromagnetic energy absorbing transducing material, the layered approach to signal transformation can be employed to help balance what may otherwise be several conflicting goals by addressing them individually (e.g., by a corresponding individual layer or combination of layers) to help improve efficiency for the desired application.

Figure 15:
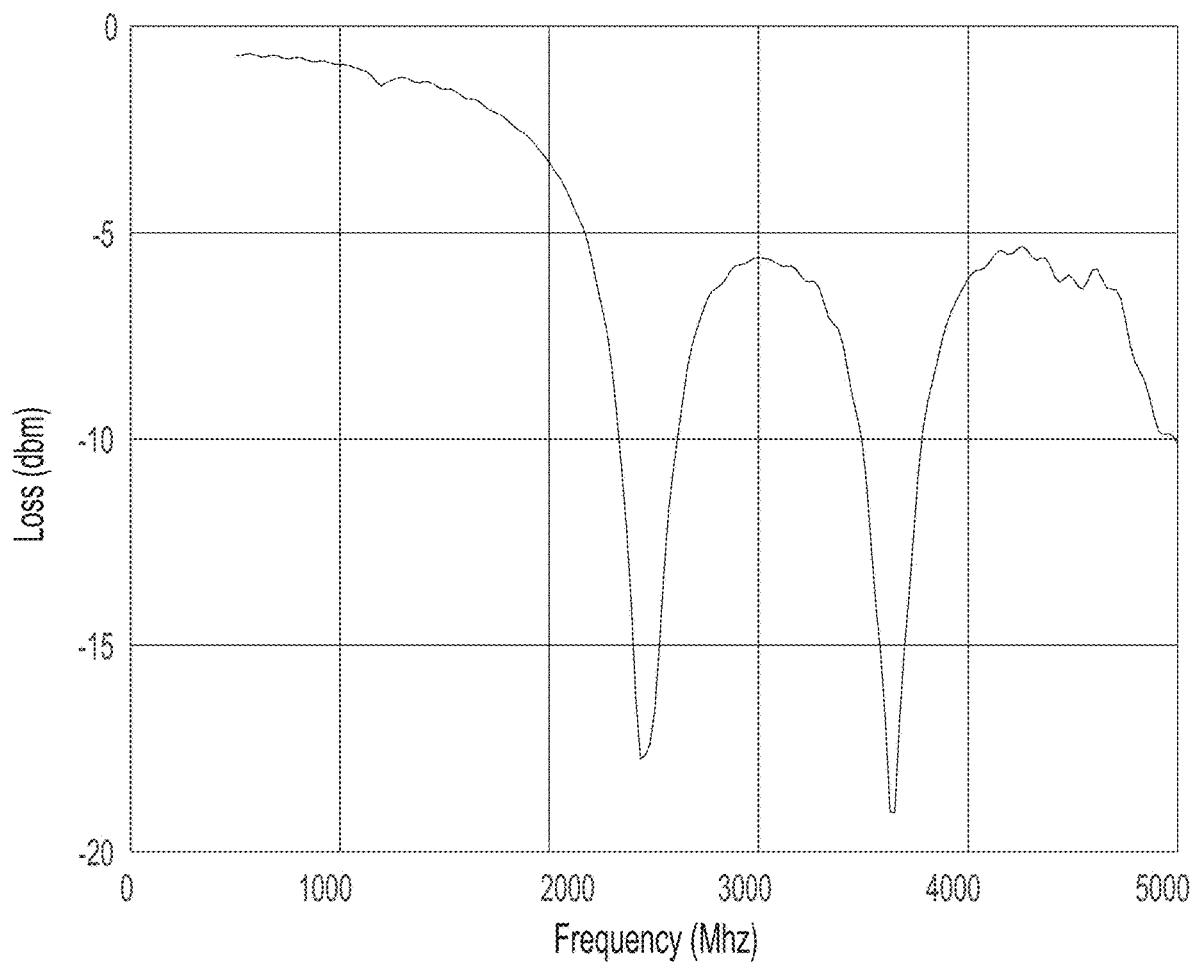
FIG. 15 is an experimental spectral graph of loss (dBm) vs. frequency (MHz) for a sample in which barium titanate and carbon are evenly mixed into a single layer sample.

FIG. 15 is an experimental spectral graph of loss (dBm) vs. frequency (MHz) for a sample in which barium titanate and carbon are evenly mixed into a single layer sample. In FIG. 15, two loss peak minimas appear, such that the sample will generate heat most effectively at the corresponding two different frequencies. Also, in FIG. 15, the overall maximum loss has decreased from −35 dbm to −18 dbm, meaning that less AC electromagnetic input energy will be converted into heat in the sample used for generating the experimental spectral graph of FIG. 15.

Figure 16:
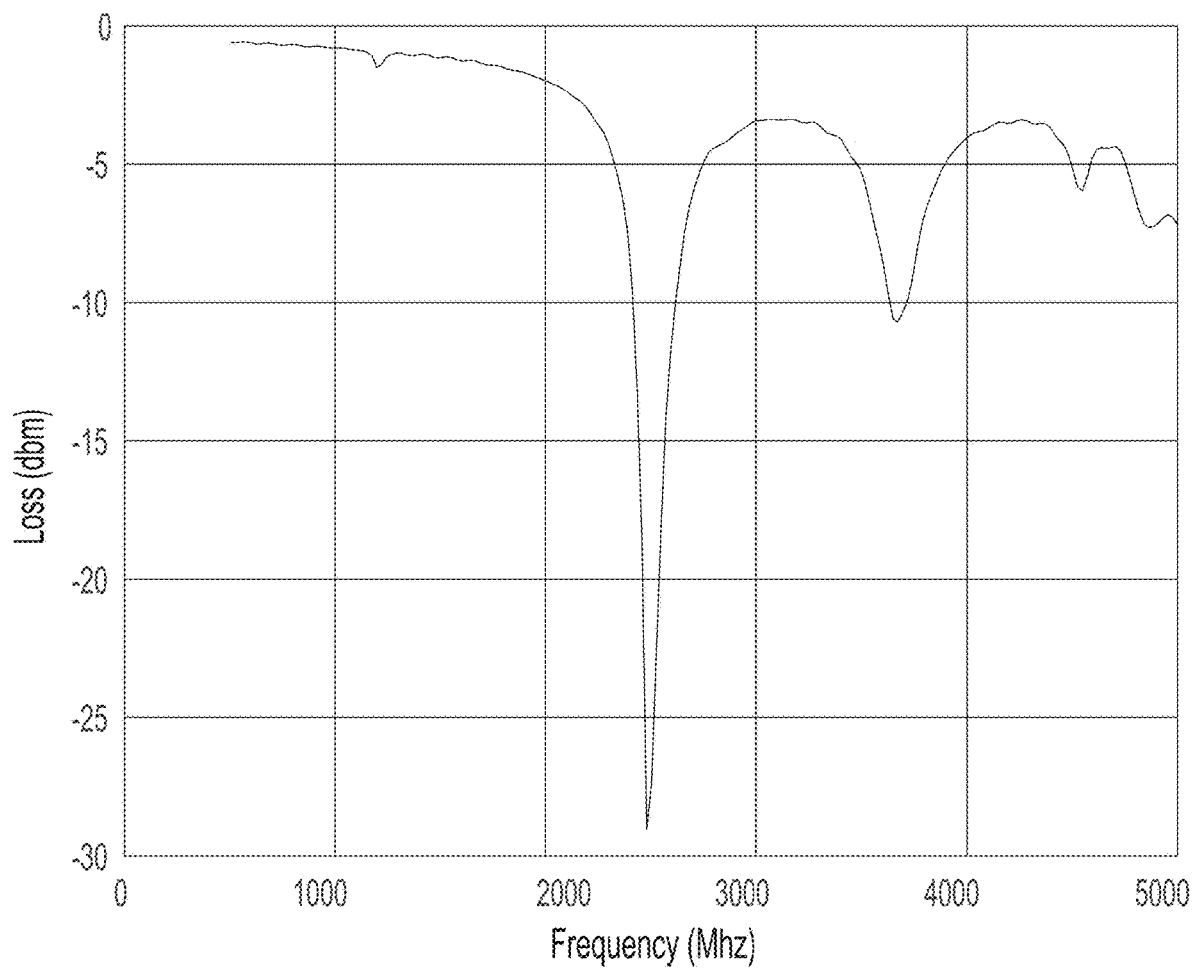
FIG. 16 is an experimental spectral graph of loss (dBm) vs. frequency (MHz) for a sample in which barium titanate is the dominant additive component to the polyurethane base at 19% barium titanate by weight.

FIG. 16 is an experimental spectral graph of loss (dBm) vs. frequency (MHz) for a sample in which barium titanate is the dominant additive component to the polyurethane base at 19% barium titanate by weight. In the example corresponding to FIG. 16, a very tiny quantity of silver has also been added into the polyurethane base material. Adding such a small quantity of silver to the polyurethane base material can help enable fluoroscopic imaging of the resulting material, which can be very beneficial, for example, in which the application in which the heating device is to be used is a medical device to be introduced into the body of a human or animal patient, and guided to a desired location within the patient under fluoroscopic imaging for viewing and visualization assistance within the patient's body.

Figure 17:
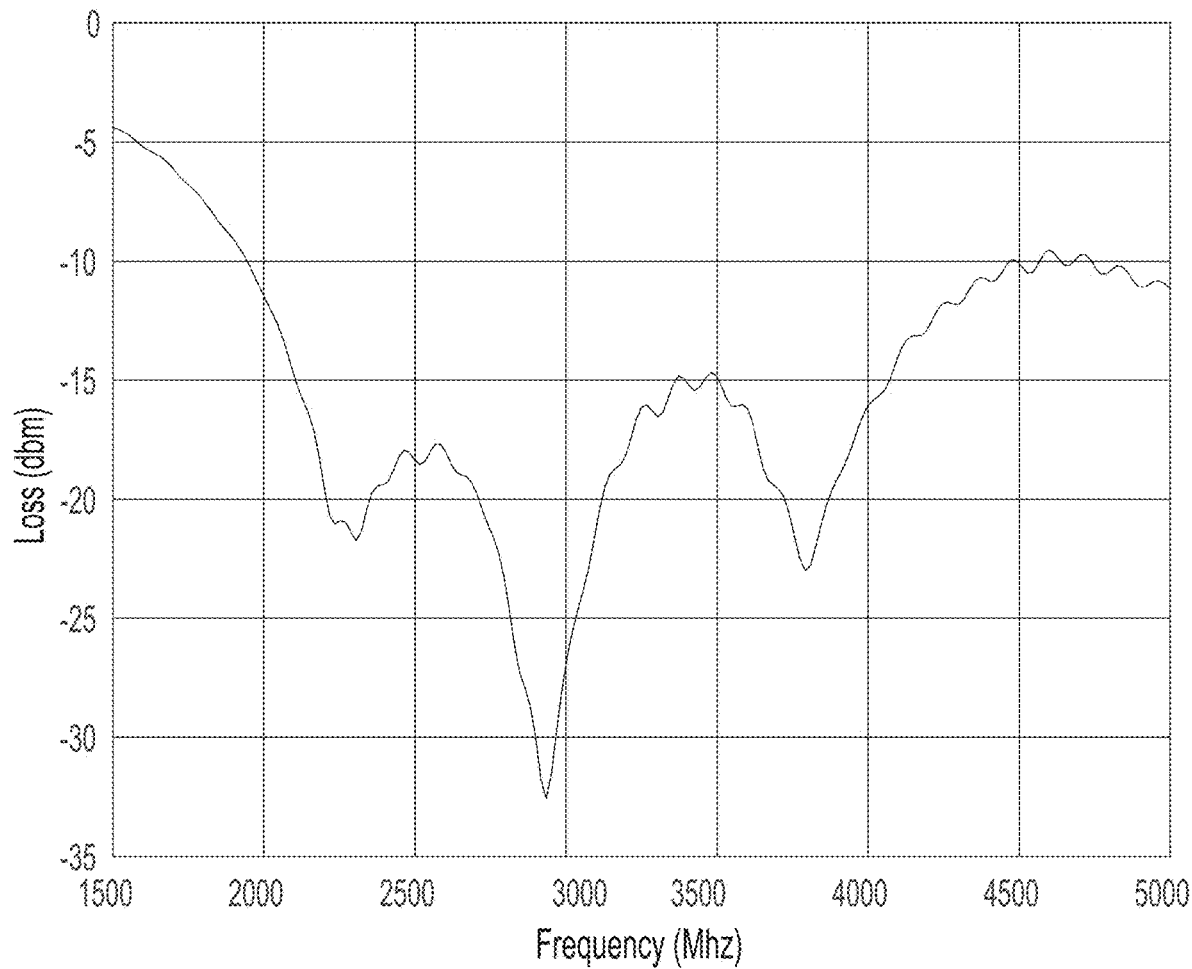
FIG. 17 is an experimental spectral graph of loss (dBm) vs. frequency (MHz) for a sample in which carbon and graphite are added to the polyurethane base material in the same sole layer.

FIG. 17 is an experimental spectral graph of loss (dBm) vs. frequency (MHz) for a sample in which carbon and graphite are added to the polyurethane base material in the same sole layer. In the example corresponding to FIG. 17, one of the loss peak minimas has shifted lower than 2.4 GHz. The added graphite in the example corresponding to FIG. 17 provides another electromagnetic energy absorber. Graphite is also a conductor of electricity. By adding the graphite, such as shown in the example corresponding to FIG. 17, the effect is to shift a loss peak minima in frequency to a frequency that is above 2.4 GHz, that is, to a frequency that is just under 3.0 GHZ.

Figure 18:
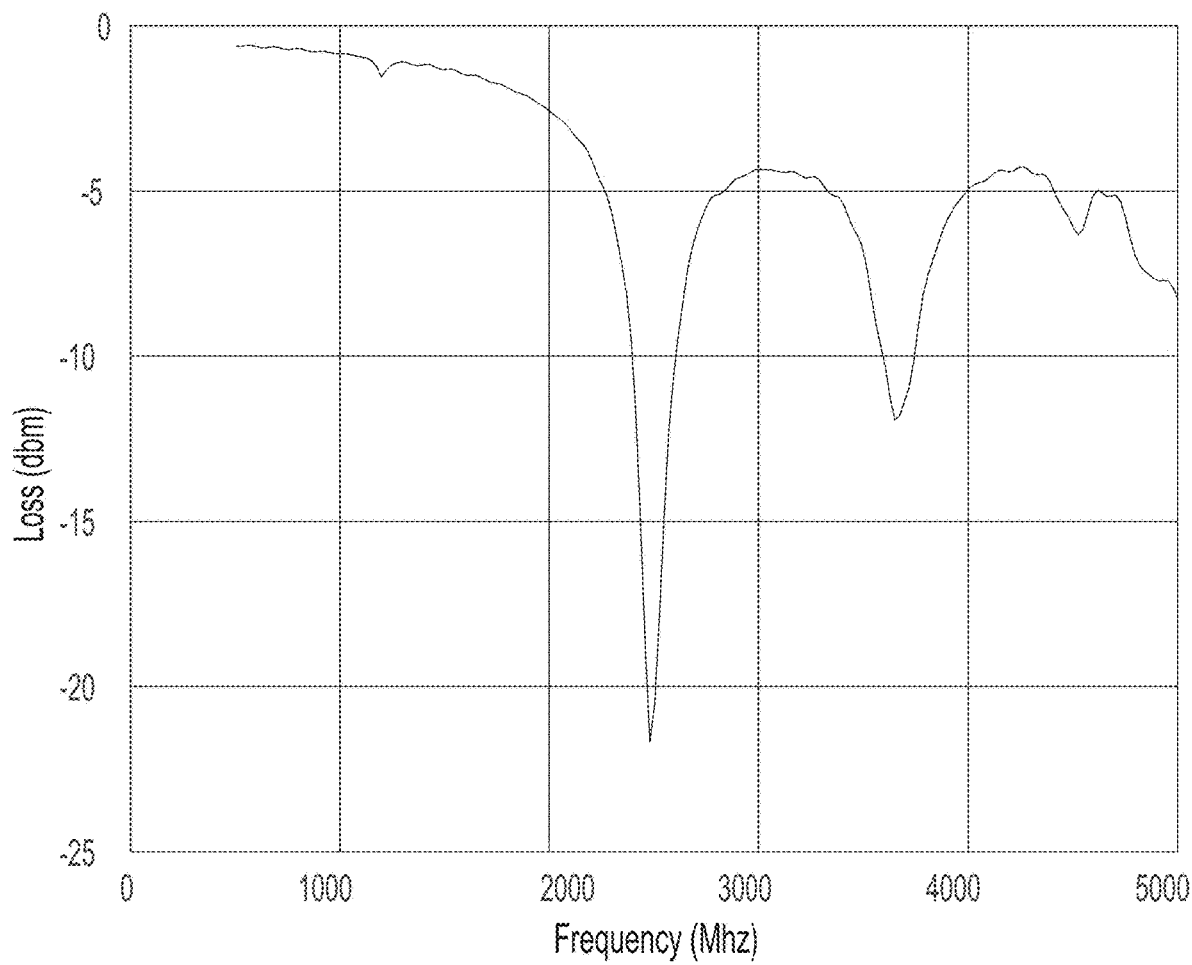
FIG. 18 is an experimental spectral graph of loss (dBm) vs. frequency (MHz) for a sample in which barium titanate is the dominant additive into the polyurethane material base.

FIG. 18 is an experimental spectral graph of loss (dBm) vs. frequency (MHz) for a sample in which barium titanate is the dominant additive into the polyurethane material base. In the example corresponding to FIG. 18, the effect is in stabilizing the frequency of the loss peak minima. As also seen in FIG. 18, less loss occurs at the loss peak minima than for the case in which 40% carbon was introduced into the polyurethane base material.

The above description has emphasized a particular application in which engineered active substrate materials can be used to provide heat source transducers. The heat source transducers are actuatable and energizable by applied AC electromagnetic input energy. The locations of actuated heat source transducers can be selected by tuning a frequency of the applied AC electromagnetic input energy signal, which can be applied to planar resonators that resonate at different frequencies. In this way, a particular heat source transducer location can be selected for actuation by applying the AC electromagnetic input energy signal at the resonant frequency of that one or more particular heat source transducer that is desired to be actuated for generating heat.

However, the frequency-selectable and frequency-actuatable transducers need not be limited to electromagnetic-to-heat transducers. Other types of transducers or other components can similarly be selected for actuation by tuning a frequency of an AC electromagnetic input signal to a particular frequency to which another type of transducer or other component responds, such as by being actuated by a resonance of a planar resonator associated with that particular transducer or other component. As an example of another type of transducer (other than a heat source) that can similarly be selectively actuated by tuning a frequency of an AC electromagnetic input signal, can include a piezoelectric transducer that can convert received AC electromagnetic energy into acoustic or vibrational energy. As a further example, an electrical circuit can be formed in the active substrate and can be similarly selectively actuated by tuning a frequency of an AC electromagnetic input signal. For example, a capacitive element can be used to receive electromagnetic input energy via a selectively addressed resonating planar resonator, and the capacitive element can be charged to provide energy to operate an electrical circuit that is electrically connected to the capacitive element. In another example, a thermocouple or other thermoelectric device can similarly be selectively addressed and actuated using the techniques described or incorporated by reference herein.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electromagnetic frequency addressable transducer device comprising:
   a substrate, including a polymer base material including an electromagnetic energy responsive material, wherein the substrate includes multiple layers respectively having different material compositions, and wherein individual ones of the multiple layers include different responses to an applied AC electromagnetic input signal; and
   an electrically conductive AC electromagnetic input structure, included in or directly or indirectly on the substrate, configured to receive an applied AC electromagnetic input signal for coupling electromagnetic energy into the substrate for actuating a transducer in the substrate in response to the applied AC electromagnetic input signal.

2. The electromagnetic frequency addressable transducer device of claim 1, wherein the substrate includes a polymer substrate including a first layer and a second layer, the first layer having a composition that is more absorptive to electromagnetic energy from the applied AC electromagnetic input signal than the second layer.

3. The electromagnetic frequency addressable transducer device of claim 2, wherein the first layer includes carbon to absorb electromagnetic energy and the second layer includes barium titanate.

4. The electromagnetic frequency addressable transducer device of claim 3, wherein the substrate includes a power layer, carrying at least a portion of the electrically conductive AC electromagnetic input structure, and wherein the second layer that includes barium titanate is located between the power layer and the first layer that includes carbon.

5. The electromagnetic frequency addressable transducer device of claim 1, wherein the substrate includes a polymer substrate including a first layer and a second layer, the first layer having a composition that transduces electromagnetic energy from the applied AC electromagnetic input signal into heat to a greater degree than the second layer.

6. The electromagnetic frequency addressable transducer device of claim 5, wherein the first layer is doped with carbon to absorb electromagnetic energy and the second layer is doped with barium titanate.

7. The electromagnetic frequency addressable transducer device of claim 6, wherein the substrate includes a power layer, carrying at least a portion of the electrically conductive AC electromagnetic input structure, and wherein the second layer doped with barium titanate is located between the power layer and the first layer doped with carbon.

8. The electromagnetic frequency addressable transducer device of claim 1, wherein the transducer includes a selectively addressable lossy dielectric heating device in which the transducer is configured to be selectively actuated by establishing or tuning a frequency of the applied AC electromagnetic input signal.

9. A transducer device comprising:
a substrate, including a polymer base material including an electromagnetic energy responsive material, wherein the substrate includes multiple layers respectively having different material compositions, and wherein individual ones of the multiple layers include different responses to an applied AC electromagnetic input signal, and wherein the multiple layers include:
a first layer that includes an electromagnetic energy absorbing first doping material; and
a second layer that includes an electromagnetic energy focusing second doping material; and
an electrically conductive AC electromagnetic input structure, included in or directly or indirectly on the substrate, configured to receive an applied AC electromagnetic input signal for coupling electromagnetic energy into the substrate for actuating a transducer in the substrate in response to the applied AC electromagnetic input signal.

10. The transducer device of claim 9, wherein the polymer base material includes:
a carbon first doping material; and
a barium titanate second doping material.

11. The transducer device of claim 10, wherein the substrate includes the second doping material in a greater percentage by weight than the first doping material.

12. The transducer device of claim 10, wherein the substrate includes the first doping material in a greater percentage by weight than the second doping material.

13. The transducer device of claim 9, wherein the base material includes one or any combination of polyurethane, polyimide, silicone, polycarbonate, or other thermoplastic polymer.

14. The transducer device of claim 9, wherein the transducer includes a selectively addressable lossy dielectric heating device in which the transducer is configured to be selectively actuated by establishing or tuning a frequency of the applied AC electromagnetic input signal.

15. A device comprising:
a substrate, including a polymer base material including an electromagnetic energy responsive material, wherein the substrate includes multiple layers respectively having different material compositions, and wherein individual ones of the multiple layers include different responses to an applied AC electromagnetic input signal, and wherein the multiple layers include:
a first layer that includes an electromagnetic energy absorbing first doping material that includes carbon; and
a second layer that includes an electromagnetic energy focusing second doping material that includes barium titanate; and
an electrically conductive AC electromagnetic input structure, included in or directly or indirectly on the substrate, configured to receive an applied AC electromagnetic input signal for coupling electromagnetic energy into the substrate for actuating a transducer in the substrate in response to the applied AC electromagnetic input signal, wherein the second layer is located between the first layer and the electrically conductive AC electromagnetic input structure.

16. The device of claim 15, wherein the substrate includes the second doping material in a greater percentage by weight than the first doping material.

17. The device of claim 15, wherein the substrate includes the first doping material in a greater percentage by weight than the second doping material.

18. The device of claim 15, wherein the base material includes one or any combination of polyurethane, polyimide, silicone, polycarbonate, or other thermoplastic polymer.

19. The device of claim 15, wherein the transducer includes a selectively addressable lossy dielectric heating device in which the transducer is configured to be selectively actuated by tuning a frequency of the applied AC electromagnetic input signal.

20. The device of claim 15, wherein electrically conductive AC electromagnetic input structure, included in or directly or indirectly on the substrate closer to the second layer than to the first layer.

* * * * *